US008786646B2

(12) United States Patent
Kinoshita et al.

(10) Patent No.: US 8,786,646 B2
(45) Date of Patent: Jul. 22, 2014

(54) LIGHT-EMITTING CHIP, LIGHT-EMITTING DEVICE, PRINT HEAD AND IMAGE FORMING APPARATUS

(75) Inventors: Taku Kinoshita, Ebina (JP); Yoshinao Kondoh, Ebina (JP); Seiji Ohno, Ebina (JP)

(73) Assignee: Fuji Xerox Co., Ltd., Tokyo (JP)

( * ) Notice: Subject to any disclaimer, the term of this patent is extended or adjusted under 35 U.S.C. 154(b) by 91 days.

(21) Appl. No.: 13/084,058

(22) Filed: Apr. 11, 2011

(65) Prior Publication Data

US 2012/0120176 A1  May 17, 2012

(30) Foreign Application Priority Data

Nov. 12, 2010 (JP) .................................. 2010-253601

(51) Int. Cl.

| B41J 2/385 | (2006.01) |
|---|---|
| G03G 15/04 | (2006.01) |
| H01L 27/15 | (2006.01) |
| G03G 15/32 | (2006.01) |
| B41J 2/41 | (2006.01) |
| B41J 2/45 | (2006.01) |
| G03G 13/04 | (2006.01) |
| G01D 15/06 | (2006.01) |
| G11B 3/00 | (2006.01) |
| H01L 29/205 | (2006.01) |
| H01L 29/207 | (2006.01) |
| H01L 33/00 | (2010.01) |

(52) U.S. Cl.
CPC ........ G03G 15/04036 (2013.01); H01L 27/153 (2013.01); G03G 15/326 (2013.01); H01L 33/0016 (2013.01); H01L 27/15 (2013.01)
USPC ........... 347/130; 347/111; 347/112; 347/131; 347/132; 347/133; 347/134; 347/135; 347/238; 257/91; 257/93; 257/95; 257/98

(58) Field of Classification Search
USPC ........... 347/111, 112, 130–135, 238; 257/91, 257/93, 95, 98
See application file for complete search history.

(56) References Cited

U.S. PATENT DOCUMENTS

| 5,177,405 | A | | 1/1993 | Kusuda et al. |
|---|---|---|---|---|
| 6,064,418 | A | * | 5/2000 | Shimizu et al. ............... 347/238 |
| 6,180,960 | B1 | * | 1/2001 | Kusuda et al. .................. 257/91 |
| 7,759,754 | B2 | * | 7/2010 | Gunther et al. ............... 257/434 |
| 8,546,826 | B2 | * | 10/2013 | Marfeld et al. ................. 257/91 |

FOREIGN PATENT DOCUMENTS

| DE | 102007011123 A1 | * | 9/2008 | ............ H01L 25/075 |
|---|---|---|---|---|
| JP | A-02-263668 | | 10/1990 | |

(Continued)

OTHER PUBLICATIONS

English translation of Apr. 15, 2014 Office Action issued in Japanese Patent Application No. 2010-253601.

Primary Examiner — Laura Martin
Assistant Examiner — Jeremy Bishop
(74) Attorney, Agent, or Firm — Oliff PLC

(57) ABSTRACT

A light-emitting chip includes: a substrate; plural light-emitting elements arrayed in line on the substrate, each of the light-emitting elements including a light-emitting region having a length in an array direction of the array different from a length in a direction orthogonal to the array direction; and a light-up current supplying interconnection including plural connecting portions, each of the connecting portions being provided on the light-emitting region of a corresponding one of the light-emitting elements in a shorter direction of the light-emitting region either the array direction or the direction orthogonal to the array direction, each of the connecting portions being connected to an electrode provided on the light-emitting region, the light-up current supplying interconnection supplying a current for lighting up to the plural light-emitting elements through the plural connecting portions.

18 Claims, 11 Drawing Sheets

(56) References Cited

FOREIGN PATENT DOCUMENTS

| | | |
|---|---|---|
| JP | A-10-202947 | 8/1998 |
| JP | A-2001-94155 | 4/2001 |
| JP | A-2001-244504 | 9/2001 |
| JP | A-2005-259856 | 9/2005 |

* cited by examiner

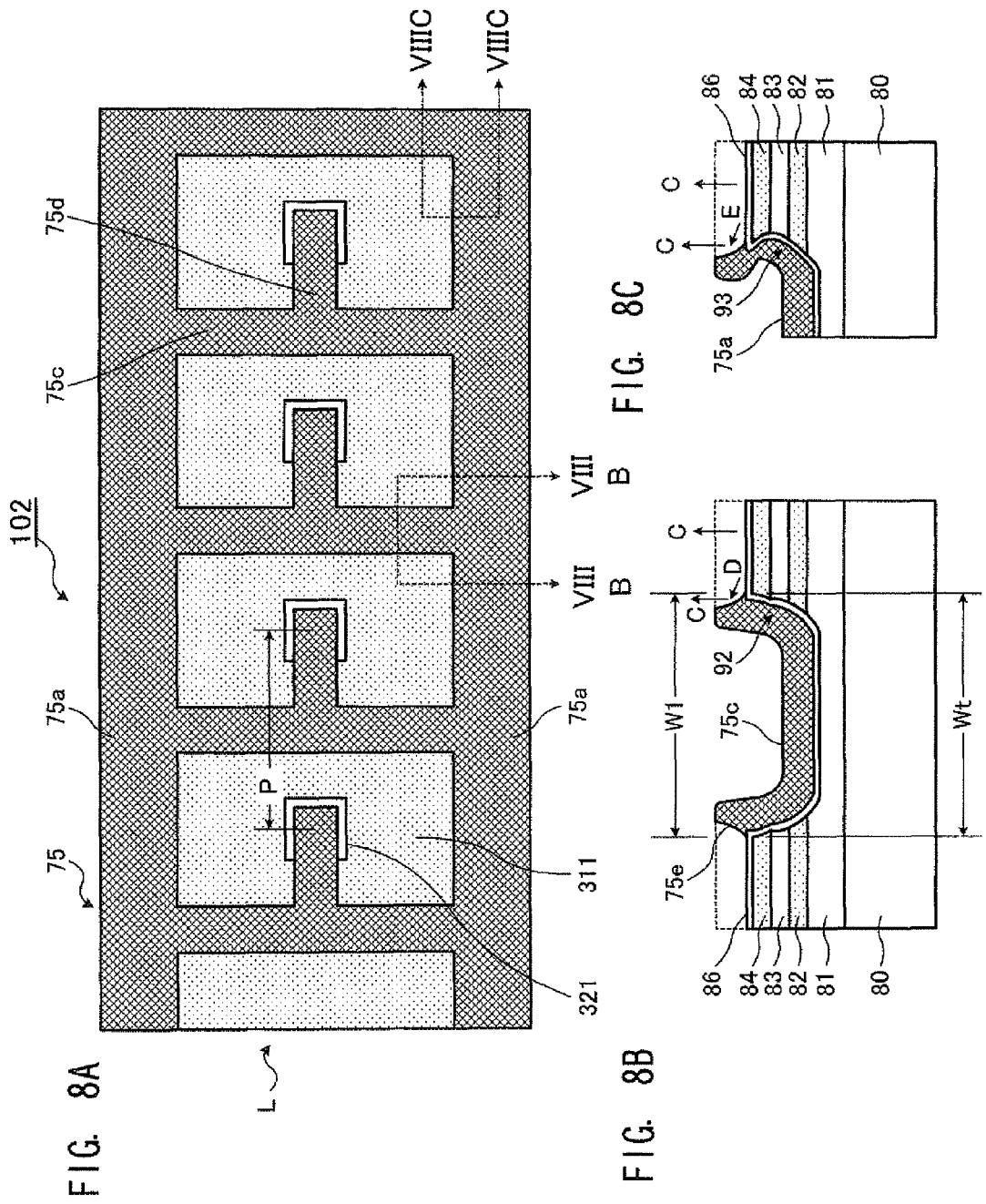

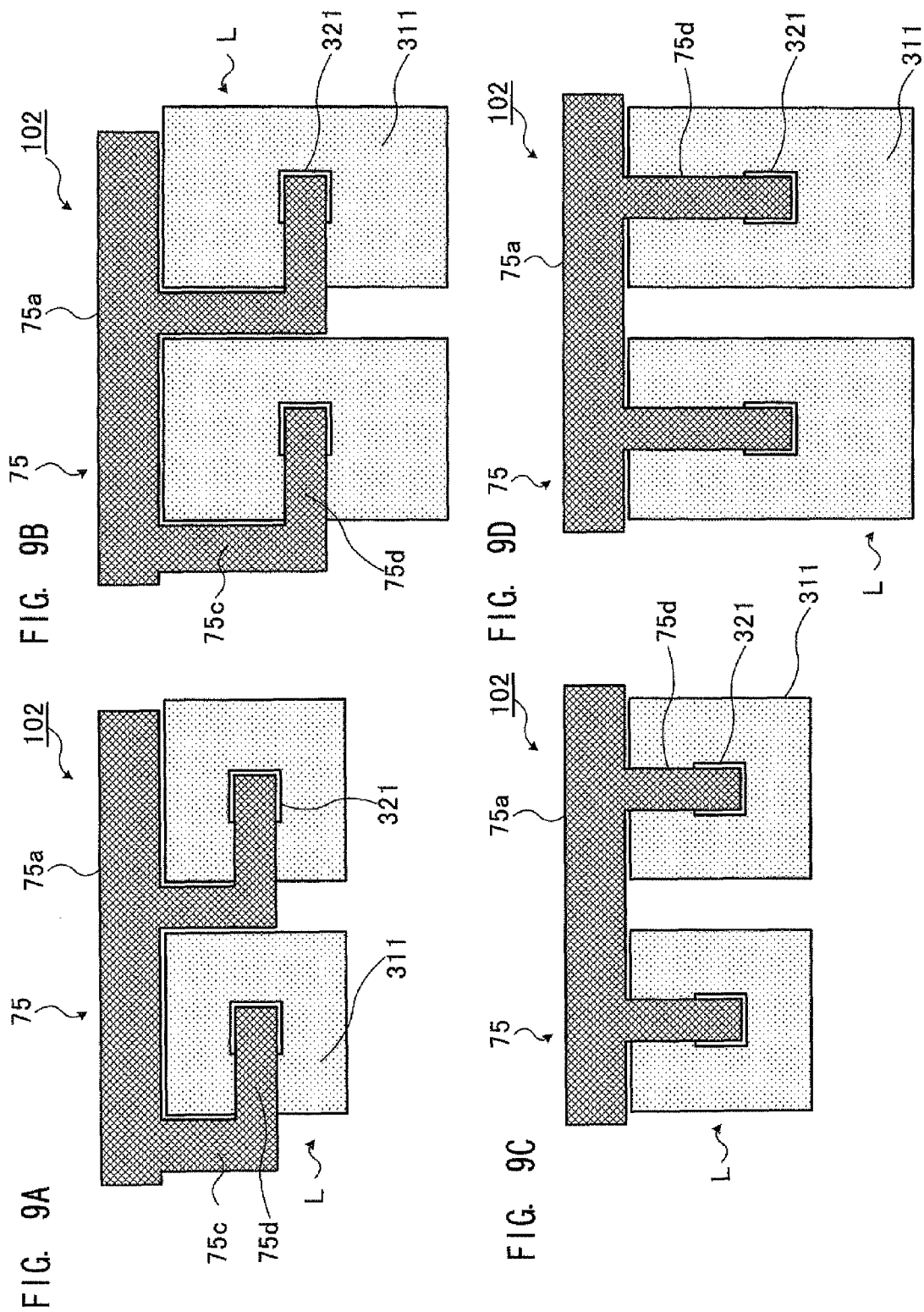

LIGHT-EMITTING CHIP, LIGHT-EMITTING DEVICE, PRINT HEAD AND IMAGE FORMING APPARATUS

CROSS REFERENCE TO RELATED APPLICATIONS

This application is based on and claims priority under 35 USC §119 from Japanese Patent Application No. 2010-253601 filed Nov. 12, 2010.

BACKGROUND

1. Technical Field

The present invention relates to a light-emitting chip, a light-emitting device, a print head and an image forming apparatus.

2. Related Art

In recent years, there has been employed a recording device using an LED print head (LPH) including a large number of light-emitting diodes (LEDs), serving as light-emitting elements, arrayed in the first scanning direction.

SUMMARY

According to an aspect of the present invention, there is provided a light-emitting chip including: a substrate; plural light-emitting elements arrayed in line on the substrate, each of the light-emitting elements including a light-emitting region having a length in an array direction of the array different from a length in a direction orthogonal to the array direction; and a light-up current supplying interconnection including plural connecting portions, each of the connecting portions being provided on the light-emitting region of a corresponding one of the light-emitting elements in a shorter direction of the light-emitting region either the array direction or the direction orthogonal to the array direction, each of the connecting portions being connected to an electrode provided on the light-emitting region, the light-up current supplying interconnection supplying a current for lighting up to the plural light-emitting elements through the plural connecting portions.

BRIEF DESCRIPTION OF THE DRAWINGS

Exemplary embodiments of the present invention will be described in detail based on the following figures, wherein:

FIGS. 8A to 8C are views for illustrating the structure of the light-emitting portion of the light-emitting chip in the first exemplary embodiment;

FIGS. 9A to 9D are views illustrating a case where the connecting portions of the light-up signal line are provided so as to extend in the array direction of the light-emitting thyristor array compared with a case where those are provided so as to extend in the direction orthogonal to the array direction of the light-emitting thyristor array;

DETAILED DESCRIPTION

In an electrophotographic image forming apparatus such as a printer, a copy machine or a facsimile machine, an image is formed on a recording sheet as follows. First, an electrostatic latent image is formed on a uniformly charged photoconductor by causing an optical recording unit to emit light so as to transfer image information onto the photoconductor. Then, the electrostatic latent image is made visible by being developed with a toner. Lastly, the toner image is transferred on and fixed to the recording sheet. In addition to an optical-scanning recording unit that makes an exposure by laser scanning in the first scanning direction using a laser beam, a recording device using the following LED print head (LPH) has been employed as such an optical recording unit in recent years in response to demand for downsizing the apparatus. This LPH includes a large number of light-emitting diodes (LEDs), serving as light-emitting elements, arrayed in the first scanning direction.

Meanwhile, light-emitting thyristors are used as light-emitting elements in a light-emitting chip with a self-scanning light-emitting device array (SLED) mounted thereon in which plural light-emitting elements are provided in line on a substrate and sequentially light-controlled. A light-emitting thyristor has a four-layer structure of pnpn unlike a light-emitting diode, and mainly emits light with two inner layers of the four-layer structure. Thus, a light-emitting thyristor has a characteristic that a less amount of light (light amount) may be extracted outside as compared with a typical light-emitting diode having two simple layers. Accordingly, as for light-emitting thyristors, in order to increase the amount of light emitted from light-emitting elements, it is more necessary to have larger light-emitting regions emitting light of light-emitting elements and to efficiently extract the light from the light-emitting elements.

Hereinafter, a description will be given of exemplary embodiments of the present invention in detail with reference to the accompanying drawings.

[First Exemplary Embodiment]
(Image Forming Apparatus 1)

Figure 1:
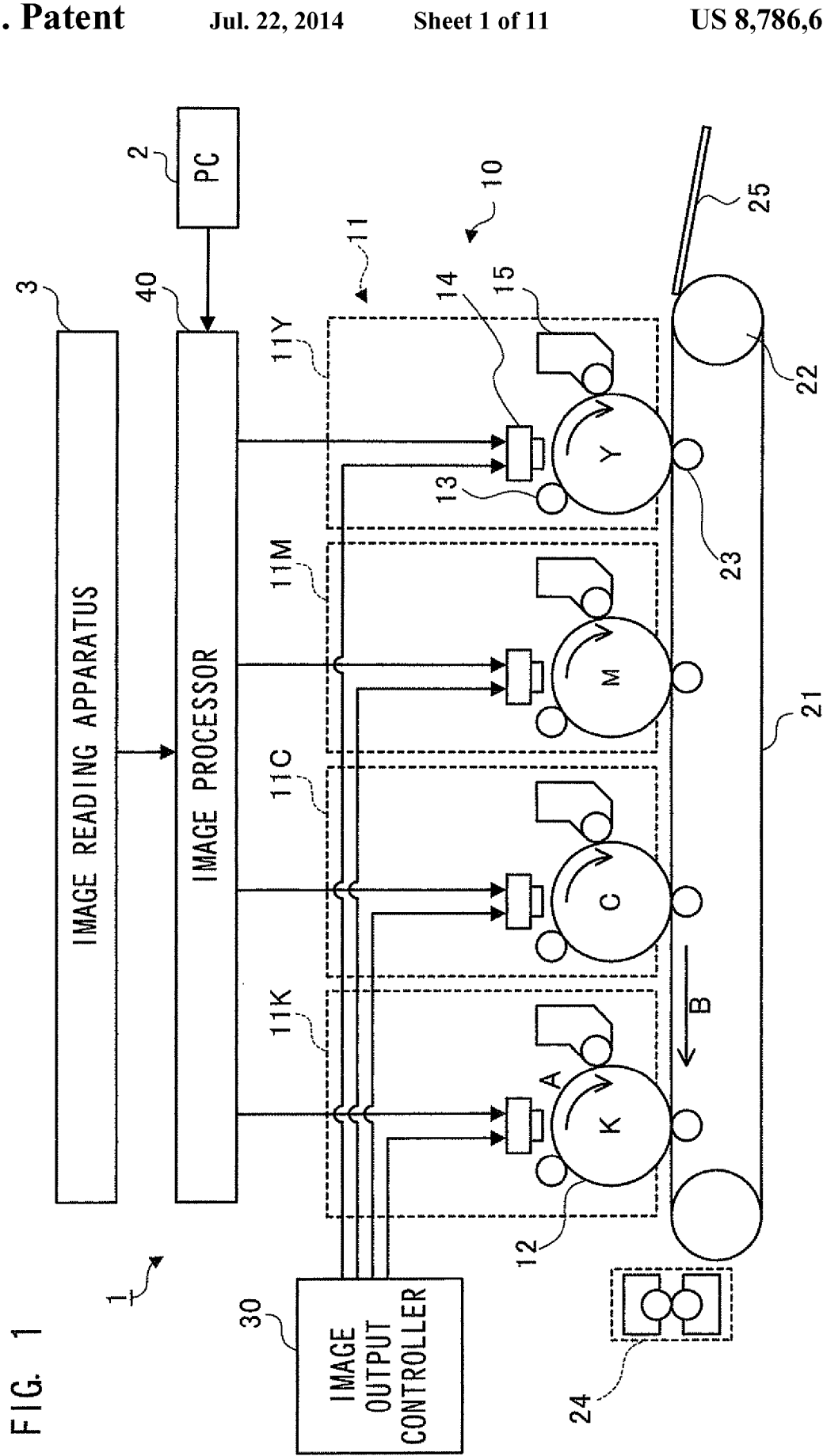
FIG. 1 is a diagram showing an example of an overall configuration of an image forming apparatus to which the first exemplary embodiment is applied.

FIG. 1 is a diagram showing an example of an overall configuration of an image forming apparatus 1 to which the first exemplary embodiment is applied. The image forming apparatus 1 shown in FIG. 1 is what is generally termed as a tandem image forming apparatus. The image forming apparatus 1 includes an image forming process unit 10, an image output controller 30 and an image processor 40. The image forming process unit 10 forms an image in accordance with different color image data. The image output controller 30 controls the image forming process unit 10. The image processor 40, which is connected to devices, such as a personal computer (PC) 2 and an image reading apparatus 3, performs predetermined image processing on image data received from the above devices.

The image forming process unit 10 includes image forming units 11 including plural engines arranged in parallel at predetermined intervals. The image forming units 11 are composed of four image forming units 11Y, 11M, 11C and 11K. Each of the image forming units 11Y, 11M, 11C and 11K includes a photoconductive drum 12, a charging device 13, a print head 14 and a developing device 15. On the photoconductive drum 12, as an example of an image carrier, an electrostatic latent image is formed, and the photoconductive drum 12 retains a toner image. The charging device 13, as an example of a charging unit, charges the surface of the photoconductive drum 12 at a predetermined potential. The print head 14 exposes the photoconductive drum 12 charged by the charging device 13. The developing device 15, as an example of a developing unit, develops an electrostatic latent image formed by the print head 14. The image forming units 11Y, 11M, 11C and 11K form yellow (Y), magenta (M), cyan (C) and black (K) toner images, respectively.

Additionally, the image forming process unit 10 includes a sheet transport belt 21, a drive roll 22, transfer rolls 23 and a fixing device 24. The sheet transport belt 21 transports a recording sheet 25, as an example of a transferred body, so that color toner images respectively formed on the photoconductive drums 12 of the image forming units 11Y, 11M, 11C and 11K are transferred on the recording sheet 25 by multilayer transfer. The drive roll 22 is a roll to drive the sheet transport belt 21. Each transfer roll 23, as an example of a transfer unit, transfers a toner image formed on the corresponding photoconductive drum 12 onto the recording sheet 25. The fixing device 24 fixes the toner images on the recording sheet 25.

In this image forming apparatus 1, the image forming process unit 10 performs an image forming operation on the basis of various kinds of control signals supplied from the image output controller 30. Under the control by the image output controller 30, the image data received from the personal computer (PC) 2 or the image reading apparatus 3 is subjected to image processing by the image processor 40, and then the resultant data is supplied to the corresponding image forming unit 11. Then, for example in the black (K) color image forming unit 11K, the photoconductive drum 12 is charged at a predetermined potential by the charging device 13 while rotating in an arrow A direction, and then is exposed by the print head 14 emitting light on the basis of the image data supplied from the image processor 40. By this operation, an electrostatic latent image for a black (K) color image is formed on the photoconductive drum 12. Thereafter, the electrostatic latent image formed on the photoconductive drum 12 is developed by the developing device 15, and accordingly the black (K) color toner image is formed on the photoconductive drum 12. Yellow (Y), magenta (M) and cyan (C) color toner images are formed in the image forming units 11Y, 11M and 11C, respectively.

The color toner images on the respective photoconductive drums 12, which are formed in the respective image forming units 11, are electrostatically transferred to the recording sheet 25 supplied with the movement of the sheet transport belt 21 by a transfer electric field applied to the transfer rolls 23, in sequence. Here, the sheet transport belt 21 moves in an arrow B direction. By this operation, a synthetic toner image on which color toners are superimposed is formed on the recording sheet 25.

Thereafter, the recording sheet 25 on which the synthetic toner image is electrostatically transferred is transported to the fixing device 24. The synthetic toner image on the recording sheet 25 transported to the fixing device 24 is fixed on the recording sheet 25 through fixing processing using heat and pressure by the fixing device 24, and then is outputted from the image forming apparatus 1.

(Print Head 14)

Figure 2:
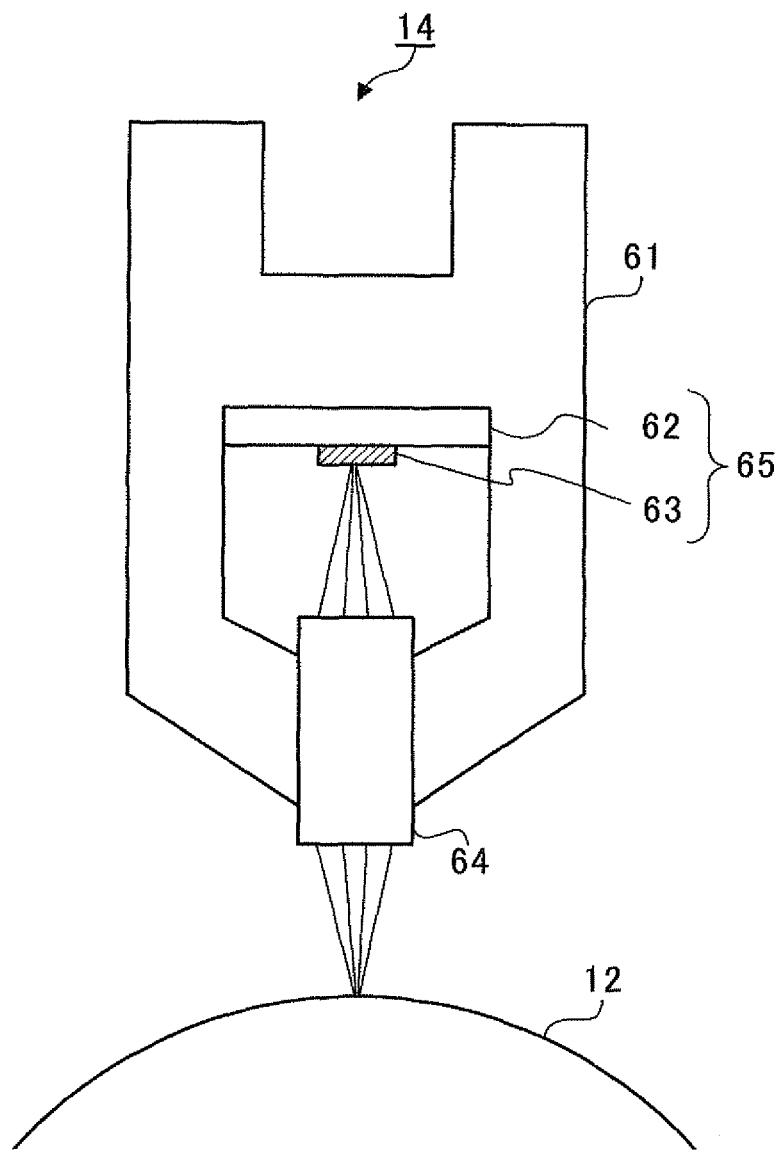
FIG. 2 is a cross-sectional view showing a structure of the print head.

FIG. 2 is a cross-sectional view showing a structure of the print head 14. The print head 14, as an example of an exposure unit, includes: a housing 61; a light-emitting device 65, as an example of a light-emitting unit, including a light source portion 63 with plural light-emitting elements (light-emitting thyristors, as an example of light-emitting elements, in the first exemplary embodiment) exposing the photoconductive drum 12; and a rod lens array 64, as an example of an optical unit, causing light emitted by the light source portion 63 to form an image on the surface of the photoconductive drum 12.

The light-emitting device 65 also includes a circuit board 62 on which the above light source portion 63, a signal generating circuit 110 (see FIG. 3 to be described later) driving the light source portion 63, and the like are mounted.

The housing 61 is made of metal, for example, and supports the circuit board 62 and the rod lens array 64. The housing 61 is set so that the light-emitting points of the light-emitting elements in the light source portion 63 are located on the focal plane of the rod lens array 64. In addition, the rod lens array 64 is arranged in an axial direction of the photoconductive drum 12 (that is the first scanning direction and the X direction in FIGS. 3 and 4B to be described later).

(Light-Emitting Device 65)

Figure 3:
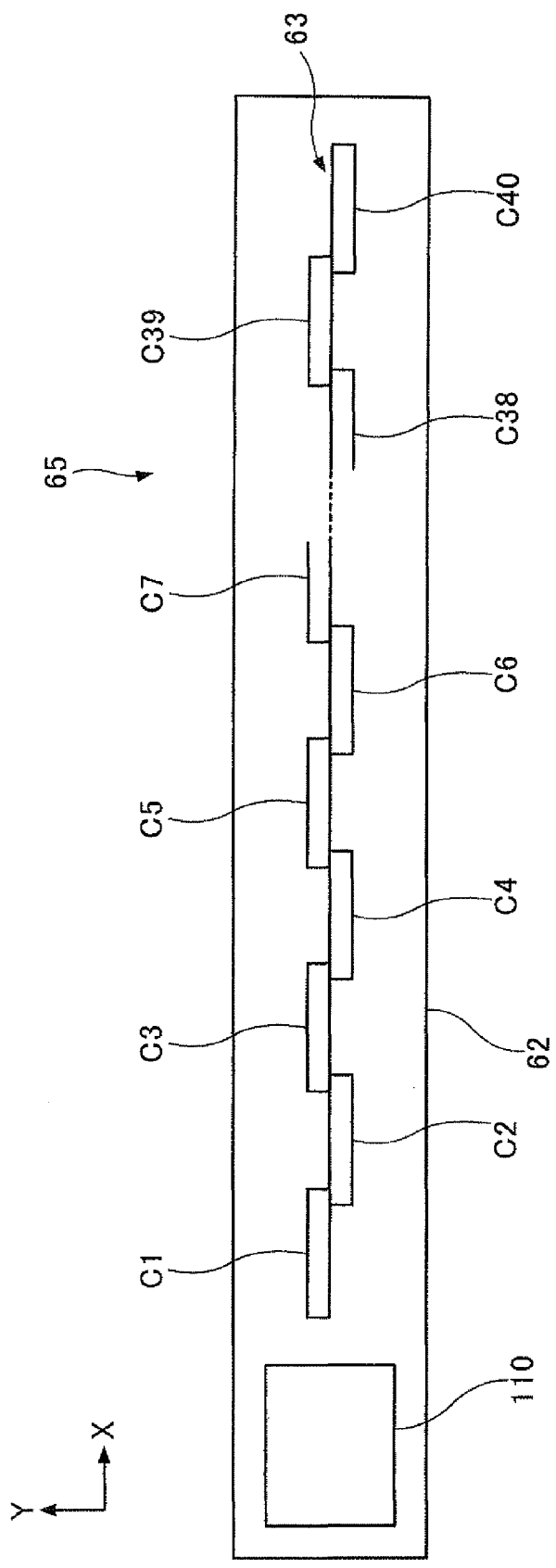
FIG. 3 is a top view of the light-emitting device.

FIG. 3 is a top view of the light-emitting device 65.

As shown in FIG. 3, in the light-emitting device 65, the light source portion 63 is configured with forty light-emitting chips C1 to C40 arranged on the circuit board 62 in two lines in the X direction, which is the first scanning direction, in a staggered manner.

In this specification, the notation "C1 to C40" represents plural light-emitting chips that are distinguished from each other by indices, and is meant to include the light-emitting chips C1 and C40 as well as those with indices therebetween. That is, "light-emitting chips C1 to C40" include those from the light-emitting chip C1 to the light-emitting chip C40 in numerical order of the indices. The same holds true for other components.

The configurations of the light-emitting chips C1 to C40 may be the same with each other. Thus, the light-emitting chips C1 to C40, when not separately distinguished, are labeled as light-emitting chips C.

The number of the light-emitting chips C is forty in total in the first exemplary embodiment; however, the configuration is not limited to this.

As described above, the light-emitting device 65 is mounted with the signal generating circuit 110 driving the light source portion 63. The signal generating circuit 110 is configured with an integrated circuit (IC) or the like, for example.

The array of the light-emitting chips C1 to C40 will be described later in detail.

FIGS. 4A and 4B are diagrams showing configurations of a light-emitting chip C, the signal generating circuit 110 of the light-emitting device 65 and interconnections (lines) on the circuit board 62. FIG. 4A shows a configuration of the light-emitting chip C, and FIG. 4B shows a configuration of the signal generating circuit 110 of the light-emitting device 65 and a configuration of interconnections (lines) on the circuit board 62.

First, the configuration of the light-emitting chip C shown in FIG. 4A is described.

The light-emitting chip C includes a light-emitting portion 102 composed of plural light-emitting elements (light-emitting thyristors L1, L2, L3 . . . in the first exemplary embodiment) provided in line on a surface of a rectangular substrate 80 on a longitudinal edge side thereof along the longitudinal edge. The light-emitting chip C also includes terminals (φ1 terminal, φ2 terminal, Vga terminal and φI terminal) at both ends in the longitudinal direction on the surface of the substrate 80, the terminals being plural bonding pads to receive various kinds of control signals and the like. These terminals are provided in the order of the φ1 terminal and the Vga terminal from one end of the substrate 80, and are provided in the order of the φI terminal and the φ2 terminal from the other end of the substrate 80. The light-emitting portion 102 is provided between the Vga and φ2 terminals. Additionally, on the backside of the substrate 80, a backside electrode 85 (see FIG. 6B to be described later) is provided as a Vsub terminal.

Note that "in line" includes not only a case where the plural light-emitting elements are arranged in a straight line as shown in FIG. 4A, but also a case where the plural light-emitting elements are arranged with displacements different from each other in the direction orthogonal to the array direction. For example, when a light-emitting region of a light-emitting element is regarded as a pixel, the light-emitting elements may be arranged with displacements of several or several tens of pixels in the direction orthogonal to the array direction. Instead, the light-emitting elements may be arranged alternately between every two adjacent light-emitting elements, or arranged in a zigzag pattern for each of the plural light-emitting elements.

Next, the configuration of the signal generating circuit 110 of the light-emitting device 65 and the configuration of the interconnections (lines) on the circuit board 62 are described with reference to FIG. 4B.

As described above, the circuit board 62 of the light-emitting device 65 is mounted with the signal generating circuit 110 and the light-emitting chips C1 to C40, and provided with interconnections (lines) to connect between the signal generating circuit 110 and the light-emitting chips C1 to C40.

First, the configuration of the signal generating circuit 110 is described.

The signal generating circuit 110 receives input of image data subjected to image processing and various kinds of control signals from the image output controller 30 and the image processor 40 (see FIG. 1). The signal generating circuit 110 rearranges the image data and corrects the amount of light based on the image data and various kinds of control signals.

The signal generating circuit 110 includes a transfer signal generating part 120 as an example of a transfer signal supplying unit transmitting a first transfer signal φ1 and a second transfer signal φ2, which are an example of transfer signals, to the light-emitting chips C1 to C40 based on various kinds of control signals.

The signal generating circuit 110 also includes a light-up signal generating part 140 as an example of a light-up current supplying unit transmitting light-up signals φI1 to φI40 to the light-emitting chips C1 to C40, respectively, based on various kinds of control signals. The light-up signals φI1 to φI40, when not separately distinguished, are labeled as light-up signals φI.

Furthermore, the signal generating circuit 110 includes a reference potential supplying part 160 supplying a reference potential Vsub being a reference of a potential to the light-emitting chips C1 to C40, and a power supply potential supplying part 170 supplying a power supply potential Vga for driving the light-emitting chips C1 to C40.

Next, the array of the light-emitting chips C1 to C40 is described.

The odd-numbered light-emitting chips C1, C3, C5 . . . are arrayed in line at intervals in the longitudinal direction of the respective substrates 80. The even-numbered light-emitting chips C2, C4, C6 . . . are also arrayed in line at intervals in the longitudinal direction of the respective substrates 80. The odd-numbered light-emitting chips C1, C3, C5 . . . and the even-numbered light-emitting chips C2, C4, C6 . . . are arrayed in a staggered manner while being rotated by 180 degrees with respect to each other so that the longitudinal edges on the sides of light-emitting portions 102 provided in the respective light-emitting chips C face each other. The positions of the light-emitting chips C are set so that the light-emitting elements are aligned in the first scanning direction at predetermined intervals between the light-emitting chips C. Directions of the alignment of the light-emitting elements (in the first exemplary embodiment, numerical order of the light-emitting thyristors L1, L2, L3 . . . ) of the light-emitting portions 102 shown in FIG. 4A are indicated with arrows in the light-emitting chips C1, C2, C3 . . . of FIG. 4B.

The interconnections (lines) to connect between the signal generating circuit 110 and the light-emitting chips C1 to C40 are described.

The circuit board 62 is provided with a power supply line 200*a* that is connected to the backside electrode 85 (see FIG. 6B to be described later) and supplies the reference potential Vsub. Here, the backside electrode 85 is the Vsub terminal, and is provided to the backside of the substrate 80 of each light-emitting chip C.

The circuit board 62 is provided with a power supply line 200*b* that is connected to the Vga terminal provided to each light-emitting chip C and supplies the power supply potential Vga for driving.

The circuit board 62 is also provided with a first transfer signal line 201 and a second transfer signal line 202 to transmit the first transfer signal φ1 and the second transfer signal φ2 from the transfer signal generating part 120 of the signal generating circuit 110 to the φ1 and φ2 terminals of each of the light-emitting chips C1 to C40, respectively. The first transfer signal φ1 and the second transfer signal φ2 are transmitted in common (parallel) to the light-emitting chips C1 to C40.

Additionally, the circuit board 62 is provided with light-up signal lines 204-1 to 204-40 to respectively transmit the light-up signals φI1 to φI40 to the φI terminal of each of the light-emitting chips C1 to C40 from the light-up signal generating part 140 of the signal generating circuit 110.

As described above, the reference potential Vsub and the power supply potential Vga are supplied in common to all of the light-emitting chips C1 to C40 on the circuit board 62. The first transfer signal φ1 and the second transfer signal φ2 are also transmitted in common (parallel) to the light-emitting chips C1 to C40. On the other hand, the light-up signals φI1 to φI40 are respectively transmitted to the light-emitting chips C1 to C40.

(Light-Emitting Chip C)

Figure 4:
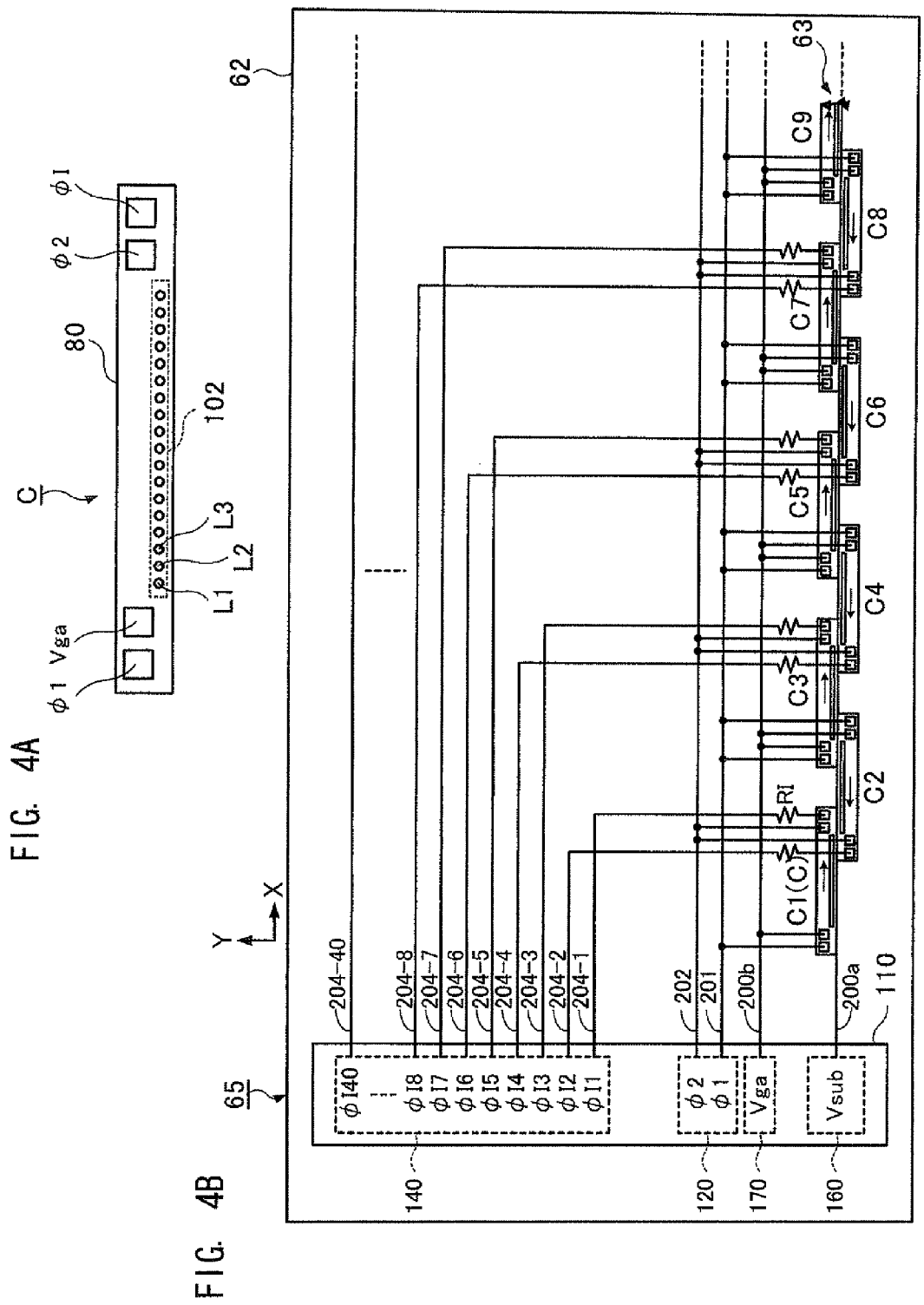
FIGS. 4A and 4B are diagrams showing configurations of a light-emitting chip, the signal generating circuit of the light-emitting device and interconnections (lines) on the circuit board.
Figure 5:
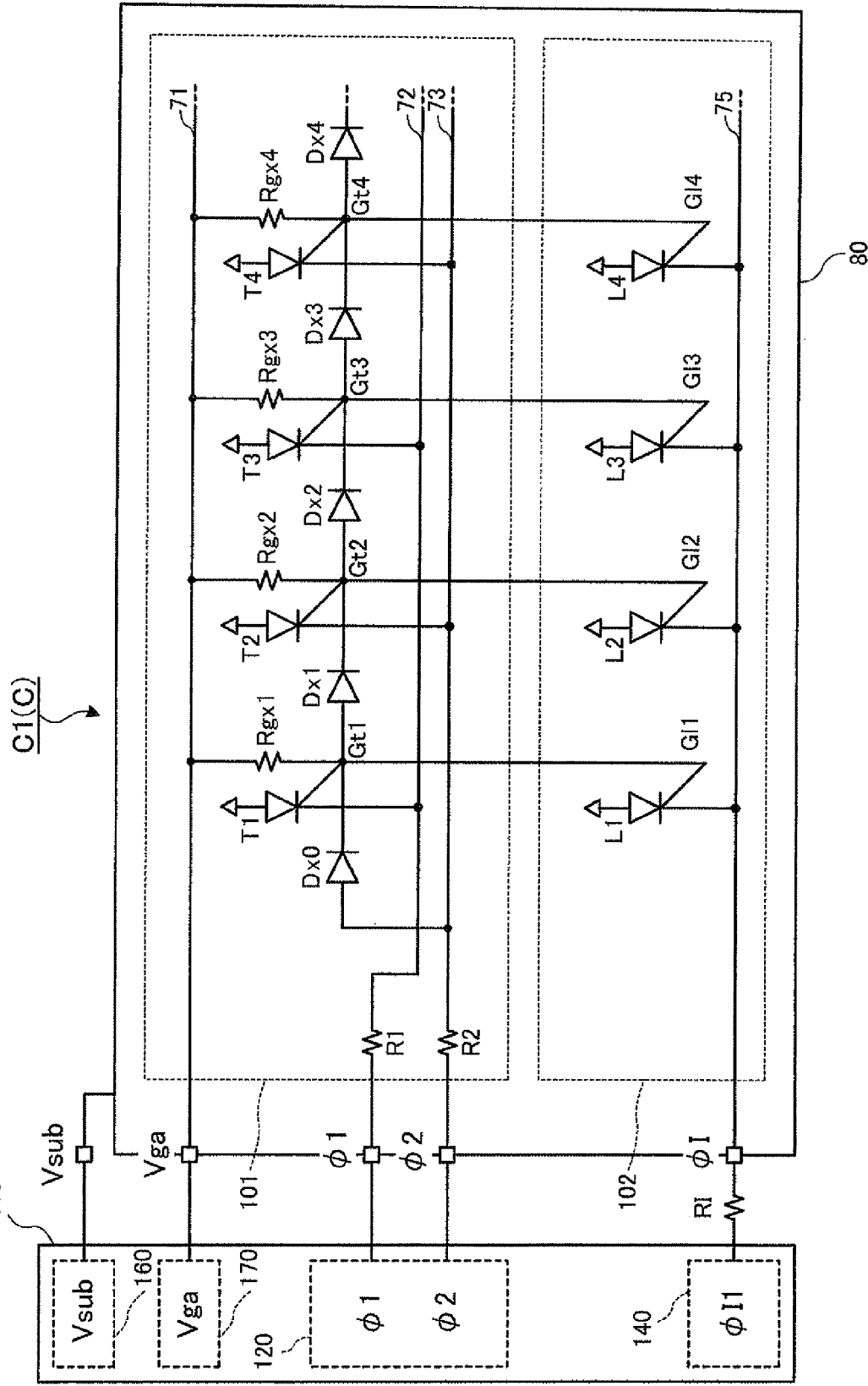
FIG. 5 is an equivalent circuit diagram for illustrating the circuit configuration of the light-emitting chip on which a self-scanning light-emitting device array (SLED) is mounted.

FIG. 5 is an equivalent circuit diagram for illustrating the circuit configuration of the light-emitting chip C on which a self-scanning light-emitting device array (SLED) is mounted. Each element described below except for the terminals (φ1 terminal, φ2 terminal, Vga terminal and φI terminal) is arranged based on a layout on each light-emitting chip C (see FIGS. 6A and 6B to be described later). The terminals (φ1 terminal, φ2 terminal, Vga terminal and φI terminal) are shown at the left end of FIG. 5 for convenience of description, although the positions thereof are different from those in FIG. 4A. Additionally, the Vsub terminal provided on the backside of the substrate 80 is shown so as to be led outside of the substrate 80.

Here, the light-emitting chips C are described in relationship to the signal generating circuit 110 by using the light-emitting chip C1 as an example. Thus, in FIG. 5, the light-emitting chip C is denoted as light-emitting chip C1 (C). The configurations of the other light-emitting chips C2 to C40 are the same as that of the light-emitting chip C1.

As described above, the light-emitting chip C1 (C) includes a light-emitting thyristor array (the light-emitting portion 102 (see FIG. 4A)), as an example of arrayed light-emitting elements, composed of the light-emitting thyristors L1, L2, L3 . . . arrayed in line on the substrate 80.

Additionally, the light-emitting chip C1 (C) includes a transfer thyristor array, as an example of arrayed transfer elements, composed of transfer thyristors T1, T2, T3 . . . , which are an example of transfer elements, arrayed in line in a similar manner as the light-emitting thyristor array.

The light-emitting chip C1 (C) also includes coupling diodes Dx1, Dx2, Dx3 . . . located between respective pairs of two adjacent transfer thyristors, T1, T2, T3 . . . taken in numerical order of the indices.

The light-emitting chip C1 (C) further includes power supply line resistances Rgx1, Rgx2, Rgx3 . . . .

Additionally, the light-emitting chip C1 (C) includes one start diode Dx0. The light-emitting chip C1 (C) also includes current limitation resistances R1 and R2 provided to prevent excess currents from flowing through a first transfer signal line 72 for transmitting the first transfer signal φ1 and a second transfer signal line 73 for transmitting the second transfer signal φ2, which will be described later.

The light-emitting thyristors L1, L2, L3 . . . in the light-emitting thyristor array and the transfer thyristors T1, T2, T3 . . . in the transfer thyristor array are arrayed in numerical order of the indices from the left in FIG. 5. Similarly, the coupling diodes Dx1, Dx2, Dx3 . . . and the power supply line resistances Rgx1, Rgx2, Rgx3 . . . are also arrayed in numerical order of the indices from the left in FIG. 5.

The light-emitting thyristor array and the transfer thyristor array are arranged in the order of the transfer thyristor array and the light-emitting thyristor array from the top to the bottom in FIG. 5.

The light-emitting thyristors L1, L2, L3 . . . , the transfer thyristors T1, T2, T3 . . . , the coupling diodes Dx1, Dx2, Dx3 . . . and the power supply line resistances Rgx1, Rgx2, Rgx3 . . . , when not separately distinguished, are denoted as light-emitting thyristors L, transfer thyristors T, coupling diodes Dx and power supply line resistances Rgx, respectively.

The number of the light-emitting thyristors L in the light-emitting thyristor array may be a predetermined number. In the first exemplary embodiment, if the number of the light-emitting thyristors L is set to 128, for example, the number of the transfer thyristors T is also 128. Similarly, the number of the power supply line resistances Rgx is also 128. However, the number of the coupling diodes Dx is 1 less than that of the transfer thyristors T, namely, 127.

Note that the number of the transfer thyristors T may be greater than that of the light-emitting thyristors L.

Each of the above-mentioned thyristors (the light-emitting thyristors L and the transfer thyristors T) is a semiconductor device having three terminals, namely, a gate terminal, an anode terminal and a cathode terminal.

Herein, the gate, anode and cathode terminals of each transfer thyristor T may be denoted as first gate, first anode and first cathode terminals, respectively. The gate, anode and cathode terminals of each light-emitting thyristor L may be denoted as second gate, second anode and second cathode terminals, respectively.

Next, electrical connection of the elements in the light-emitting chip C1 (C) is described.

The anode terminal of each transfer thyristor T and that of each light-emitting thyristor L are connected to the substrate 80 of the light-emitting chip C1 (C) (anode common).

These anode terminals are then connected to the power supply line 200a (see FIG. 4B) via the backside electrode 85 (see FIG. 6B to be described later), which is the Vsub terminal, provided on the backside of the substrate 80. The reference potential Vsub is supplied to the power supply line 200a from the reference potential supplying part 160.

The cathode terminals of the odd-numbered transfer thyristors T1, T3 . . . are connected to the first transfer signal line 72 along the array of the transfer thyristors T. The first transfer signal line 72 is then connected to the φ1 terminal via the current limitation resistance R1. The first transfer signal line 201 (see FIG. 4B) is connected to the φ1 terminal to transmit the first transfer signal φ1.

On the other hand, the cathode terminals of the even-numbered transfer thyristors T2, T4 . . . are connected to the second transfer signal line 73 along the array of transfer thyristors T. The second transfer signal line 73 is then connected to the φ2 terminal via the current limitation resistance R2. The second transfer signal line 202 (see FIG. 4B) is connected to the φ2 terminal to transmit the second transfer signal φ2.

The cathode terminals of the light-emitting thyristors L1, L2, L3 . . . are connected to a light-up signal line 75, as an example of a light-up current supplying interconnection. The light-up signal line 75 is then connected to the φI terminal. In the light-emitting chip C1, the φI terminal is connected to the light-up signal line 204-1 via a current limitation resistance RI to transmit the light-up signal φI1 from the light-up signal generating part 140. The light-up signal φI1 supplies a current for lighting up to the light-emitting thyristors L1, L2, L3 . . . . In the other light-emitting chips C2 to C40, the φI terminals are connected to the respective light-up signal lines 204-2 to 204-40 via the respective current limitation resistances RI to transmit the light-up signals φI2 to φI40.

Gate terminals Gt1, Gt2, Gt3 . . . of the transfer thyristors T1, T2, T3 . . . are respectively connected to the same numbered gate terminals Gl1, Gl2, Gl3 . . . of the light-emitting thyristors L1, L2, L3 . . . on one-to-one basis. Thus, the same numbered gate terminals Gt1, Gt2, Gt3 . . . and gate terminals Gl1, Gl2, Gl3 . . . have the same electrical potential. Accordingly, the gate terminals are denoted as gate terminal Gt1 (gate terminal Gl1), for example, to indicate that these terminals have the same potential.

The gate terminals Gt1, Gt2, Gt3 . . . and the gate terminals Gl1, Gl2, Gl3 . . . , when not separately distinguished, are denoted as gate terminals Gt and gate terminals Gl, respectively. Additionally, the gate terminals are denoted as gate terminal Gt (gate terminal Gl) to indicate that these terminals have the same potential.

The coupling diodes Dx1, Dx2, Dx3 . . . are connected between respective pairs of two adjacent gate terminals Gt taken in numerical order of the gate terminals Gt1, Gt2, Gt3 . . . of the transfer thyristors T1, T2, T3 . . . . That is, the coupling diodes Dx1, Dx2, Dx3 . . . are connected in series so as to be inserted between adjacent gate terminals Gt1 and Gt2, Gt2 and Gt3, Gt3 and Gt4 . . . , respectively. The coupling diode Dx1 is connected in a direction so that a current flows from the gate terminal Gt1 to the gate terminal Gt2. The other coupling diodes Dx2, Dx3, Dx4 . . . are also connected in the same manner.

The gate terminals Gt (gate terminals Gl) of the respective transfer thyristors T are connected to a power supply line 71 via the respective power supply line resistances Rgx provided so as to correspond to the respective transfer thyristors T. The power supply line 71 is then connected to the Vga terminal, and through the power supply line 71 the power supply potential Vga is supplied from the power supply potential supplying part 170.

The gate terminal Gt1 of the transfer thyristor T1 on one side of the transfer thyristor array is connected to the cathode terminal of the start diode Dx0. On the other hand, the anode terminal of the start diode Dx0 is connected to the second transfer signal line 73.

In FIG. 5, a portion including the transfer thyristors T, the coupling diodes Dx, the power supply line resistances Rgx, the start diode Dx0 and the current limitation resistances R1 and R2 of the light-emitting chips C1 (C) is denoted as transfer portion 101. A portion including the light-emitting thyristors L corresponds to the light-emitting portion 102.

Figures 6A, 6B:
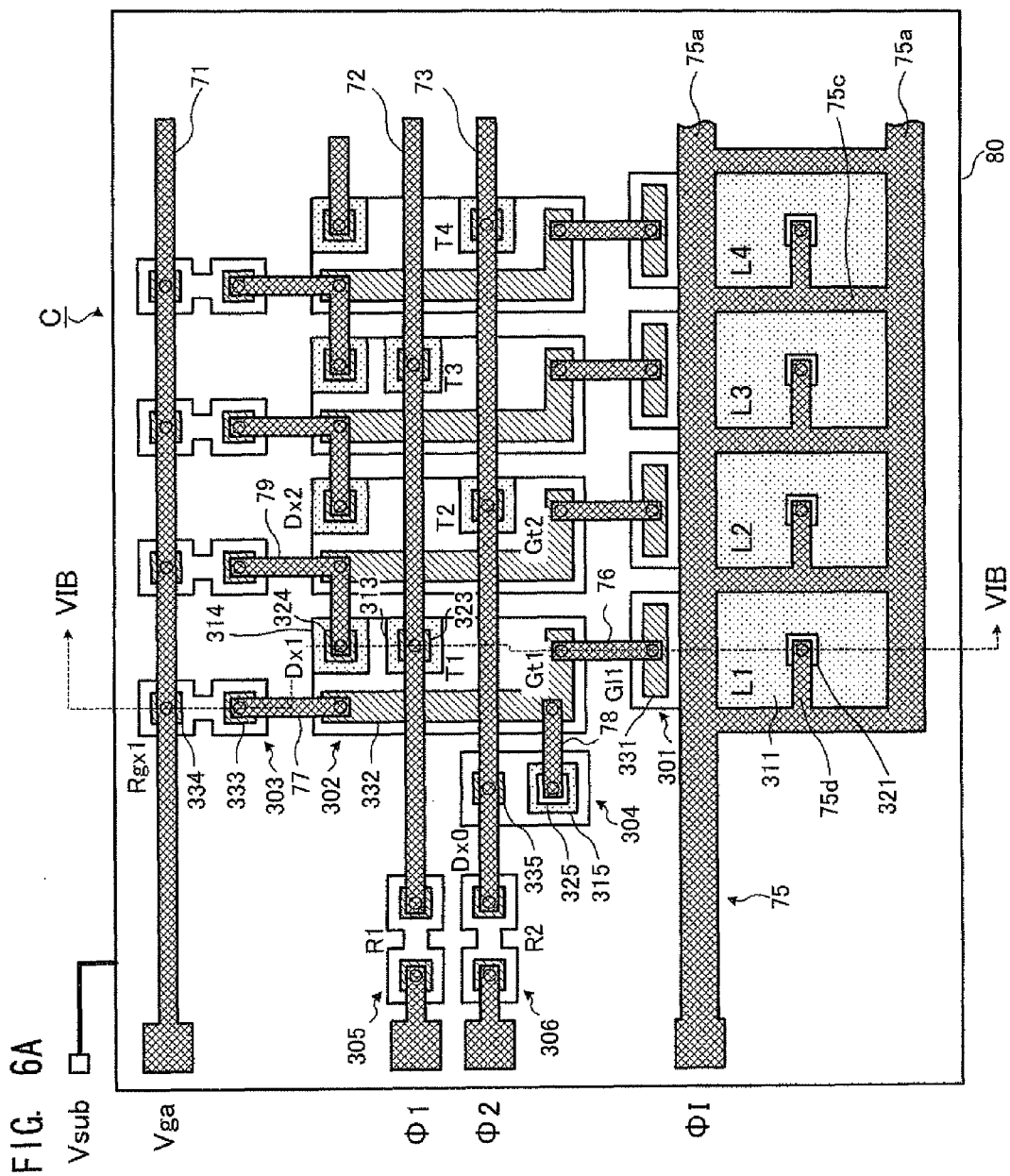
FIGS. 6A and 6B are a planar layout and a cross-sectional view of the light-emitting chip.

FIGS. 6A and 6B are a planar layout and a cross-sectional view of the light-emitting chip C. Since the connection relationship between the light-emitting chips C and the signal generating circuit 110 is not shown here, it is not necessary to use the light-emitting chip C1 as an example. Thus, notation "light-emitting chip C" is used.

FIG. 6A is a planar layout of the light-emitting chip C, and shows a portion centered on the light-emitting thyristors L1 to L4 and the transfer thyristors T1 to T4. The terminals (φ1 terminal, φ2 terminal, Vga terminal and φI terminal) are provided at the left end of FIG. 6A for convenience of description, although the positions thereof are different from those in FIG. 4A. Additionally, the Vsub terminal provided on the backside of the substrate 80 is shown so as to be led outside of the substrate 80. If the terminals are provided so as to correspond to FIG. 4A, the φ2 terminal, the φI terminal and the current limitation resistance R2 are provided at the right end of the substrate 80 in FIG. 6A. The start diode Dx0 may be provided at the right end of the substrate 80.

FIG. 6B is a cross-sectional view taken along the line VIB-VIB shown in FIG. 6A. Thus, the cross-sectional view of FIG. 6B shows the cross sections of the light-emitting thyristor L1, the transfer thyristor T1, the coupling diode Dx1 and the power supply line resistance Rgx1 in the order from the bottom to the top of FIG. 6B. In FIGS. 6A and 6B, main elements and terminals are denoted by their names.

As shown in FIG. 6B, the light-emitting chip C includes plural islands (a first island 301 to a sixth island 306 and islands with no reference numerals) formed as follows. With a compound semiconductor, such as GaAs or GaAlAs, a p-type first semiconductor layer 81, an n-type second semiconductor layer 82, a p-type third semiconductor layer 83 and an n-type fourth semiconductor layer 84 are sequentially layered on the p-type substrate 80. Then, the n-type fourth semiconductor layer 84, the p-type third semiconductor layer 83, the n-type second semiconductor layer 82 and a part of the p-type first semiconductor layer 81 having a predetermined depth from the interface with the n-type second semiconductor layer 82 are removed at peripheries thereof. Thereby, these islands are separated from each other. These islands are called mesa, and forming these islands is called mesa etching.

As shown in FIG. 6A, the first island 301 is provided with the light-emitting thyristor L1.

The second island 302 is provided with the transfer thyristor T1 and the coupling diode Dx1. The third island 303 is provided with the power supply line resistance Rgx1. The fourth island 304 is provided with the start diode Dx0. The fifth island 305 and the sixth island 306 are provided with the current limitation resistances R1 and R2, respectively.

In the light-emitting chip C, islands similar to the first island 301, the second island 302 and the third island 303 are formed in parallel. These islands are provided with the light-emitting thyristors L2, L3, L4 . . . , the transfer thyristors T2, T3, T4 . . . , the coupling diodes Dx2, Dx3, Dx4 . . . and the like in a similar manner as the first island 301, the second island 302 and the third island 303. A description thereof is omitted.

Also, the backside of the substrate 80 is provided with the backside electrode 85 being the Vsub terminal.

Here, the first island 301 to the sixth island 306 are described in detail with reference to FIGS. 6A and 6B. The power supply line 71, the first transfer signal line 72, the second transfer signal line 73 and the light-up signal line 75 will be described later.

The light-emitting thyristor L1 provided in the first island 301 has an anode terminal of the p-type first semiconductor layer 81 provided on the p-type substrate 80, a cathode terminal of an n-type ohmic electrode 321 provided on a region 311 (a light-emitting region) of the n-type fourth semiconductor layer 84, and the gate terminal Gl1 of a p-type ohmic electrode 331 provided on the p-type third semiconductor layer 83 having been exposed after removing the n-type fourth semiconductor layer 84. Light is emitted from a portion where light emission is not prevented (not blocked) by the n-type ohmic electrode 321 provided on the surface of the region 311 and the light-up signal line 75 to be described later.

In the first exemplary embodiment, the surface of the light-emitting region 311 has a shape of a rectangular region, and the shorter direction thereof is the direction of the light-emitting thyristor array of the light-emitting portion 102, while the longer direction thereof is the direction orthogonal to the light-emitting thyristor array of the light-emitting portion 102.

Hereinafter, the terms of light-emitting region 311 and n-type ohmic electrode 321 will be used not only for the light-emitting thyristor L1 but also for the other light-emitting thyristors L.

The transfer thyristor T1 provided in the second island 302 has an anode terminal of the p-type first semiconductor layer 81 provided on the p-type substrate 80, a cathode terminal of an n-type ohmic electrode 323 provided on a region 313 of the n-type fourth semiconductor layer 84, and the gate terminal Gt1 of a p-type ohmic electrode 332 provided on the p-type third semiconductor layer 83 having been exposed after removing the n-type fourth semiconductor layer 84.

Similarly, the coupling diode Dx1 provided in the second island 302 has a cathode terminal of an n-type ohmic electrode 324 provided on a region 314 of the n-type fourth semiconductor layer 84, and an anode terminal of the p-type ohmic electrode 332 provided on the p-type third semiconductor layer 83. The anode terminal of the coupling diode Dx1 and the gate terminal Gt1 of the transfer thyristor T1 are the p-type ohmic electrode 332 in common.

The power supply line resistance Rgx1 provided in the third island 303 uses, as a resistance, the p-type third semiconductor layer 83 between p-type ohmic electrodes 333 and 334 provided on the p-type third semiconductor layer 83 having been exposed after removing the n-type fourth semiconductor layer 84.

The start diode Dx0 provided in the fourth island 304 has a cathode terminal of an n-type ohmic electrode 325 provided on a region 315 of the n-type fourth semiconductor layer 84, and an anode terminal of a p-type ohmic electrode 335 provided on the p-type third semiconductor layer 83 having been exposed after removing the n-type fourth semiconductor layer 84.

Each of the current limitation resistance R1 provided in the fifth island 305 and the current limitation resistance R2 provided in the sixth island 306 uses, as a resistance, the p-type third semiconductor layer 83 between two p-type ohmic electrodes (with no reference numerals) in a similar manner as the power supply line resistance Rgx1 provided in the third island 303.

The connection relationship between the elements in FIG. 6A is described. Note that the light-up signal line 75, the first transfer signal line 72, the second transfer signal line 73, the power supply line 71 and other interconnections are connected to electrodes provided to the respective elements (n-type ohmic electrodes and p-type ohmic electrodes) via through holes (openings) (indicated by circles in FIG. 6A) provided in an insulation layer 86. A description of the insulation layer 86 and the through holes (openings) is omitted in the following description.

The light-up signal line 75 includes: two primary portions 75a provided so as to extend in the array direction of the light-emitting thyristor array; secondary portions 75c provided between islands (the first island 301 for the light-emitting thyristor L1 in FIG. 6A) on which the respective light-emitting thyristors L are provided, and extending so as to connect the two primary portions 75a with each other; and connecting portions 75d connecting the secondary portions 75c with the n-type ohmic electrodes 321 provided on the respective light-emitting regions 311. The light-emitting region 311 of the light-emitting thyristor L1 provided in the first island 301 is surrounded by the two primary portions 75a and two of the secondary portions 75c of the light-up signal line 75. Each of the connecting portions 75d is provided so as to extend in the array direction of the light-emitting thyristor array from one of the two secondary portions 75c (one on the left side of the light-emitting region 311 in FIG. 6A). The same holds true for the other light-emitting thyristors L.

The light-up signal line 75 is connected to the φI terminal with one of the two primary portions 75a being extended. Note that a wide interconnection obtained by integrating the primary portions 75a and the secondary portions 75c may be used for the light-up signal line 75 between the φI terminal and the light-emitting thyristor L1.

The first transfer signal line 72 is connected to the n-type ohmic electrode 323, which is the cathode terminal of the transfer thyristor T1 provided in the second island 302. The cathode terminals of the odd-numbered transfer thyristors T provided in islands similar to the second island 302 are also connected to the first transfer signal line 72. The first transfer signal line 72 is connected to the φ1 terminal via the current limitation resistance R1 provided in the fifth island 305.

On the other hand, the second transfer signal line 73 is connected to n-type ohmic electrodes (with no reference numerals) that are the cathode terminals of the even-numbered transfer thyristors T provided in islands with no reference numerals. The second transfer signal line 73 is connected to the φ2 terminal via the current limitation resistance R2 provided in the sixth island 306.

The power supply line 71 is connected to the p-type ohmic electrode 334, which is one terminal of the power supply line resistance Rgx1. One terminal of each of the other power supply line resistances Rgx is also connected to the power supply line 71. The power supply line 71 is connected to the Vga terminal.

The p-type ohmic electrode 331, which is the gate terminal Gl1 of the light-emitting thyristor L1 provided in the first island 301, is connected to the p-type ohmic electrode 332, which is the gate terminal Gt1 in the second island 302, through an interconnection (with no reference numeral).

The p-type ohmic electrode 332, which is the gate terminal Gt1, is connected to the p-type ohmic electrode 333, which is the other terminal of the power supply line resistance Rgx1 provided in the third island 303, through an interconnection (with no reference numeral).

The n-type ohmic electrode 324, which is the cathode terminal of the coupling diode Dx1 provided in the second island 302, is connected to a p-type ohmic electrode (with no reference numeral) that is the gate terminal Gt2 of the adjacently provided transfer thyristor T2, through an interconnection (with no reference numeral).

The p-type ohmic electrode 332, which is the gate terminal Gt1 in the second island 302, is connected to the n-type ohmic electrode 325, which is the cathode terminal of the start diode Dx0 provided in the fourth island 304, through an interconnection (with no reference numeral). The p-type ohmic electrode 335, which is the anode terminal of the start diode Dx0, is connected to the second transfer signal line 73.

Similar connection relationship, although a description thereof is omitted herein, applies to the other light-emitting thyristors L, transfer thyristors T, coupling diodes Dx and the like.

The light-emitting chip C1 (C) shown in FIG. 5 is formed in this manner.

As described above, in each of the light-emitting chips C formed by arranging light-emitting elements in line on the substrate 80, the interconnections, such as the power supply line 71, the first transfer signal line 72, the second transfer signal line 73 and the light-up signal line 75, are provided so as to extend along the light-emitting thyristor array in which the light-emitting thyristors L are arrayed in line (in the array direction).

(Operation of Light-Emitting Device 65)

Next, the operation of the light-emitting device 65 is described.

As described above, the light-emitting device 65 includes the light-emitting chips C1 to C40 (see FIGS. 3 to 4B).

As shown in FIG. 4B, the reference potential Vsub and the power supply potential Vga are supplied to all the light-emitting chips C1 to C40 on the circuit board 62 in common. Similarly, the first transfer signal φ1 and the second transfer signal φ2 are transmitted to all the light-emitting chips C1 to C40 in common (parallel).

On the other hand, the light-up signals φI1 to φI40 are respectively transmitted to the light-emitting chips C1 to C40. The light-up signals φI1 to φI40 are signals that set the light-emitting thyristors L of the respective light-emitting chips C1 to C40 either to light up or not to light up, based on image data. Thus, the light-up signals φI1 to φI40 have waveforms different from each other, depending on the image data. However, the light-up signals φI1 to φI40 are transmitted in parallel at the same timing.

Since the light-emitting chips C1 to C40 are driven in parallel, it is only necessary here to describe the operation of the light-emitting chip C1.

<Thyristor>

Prior to describing the operation of the light-emitting chip C1, a basic operation of the thyristors (the transfer thyristors T and the light-emitting thyristors L) is described. As described above, each of the thyristors is a semiconductor device having three terminals, namely, an anode terminal, a cathode terminal and a gate terminal.

In the following, as an example, the reference potential Vsub supplied to the backside electrode 85, which is the Vsub terminal, (see FIGS. 5 to 6B) is regarded as a high level potential of 0 V (hereinafter, denoted as "H"), and the power supply potential Vga supplied to the Vga terminal is regarded as a low level potential of −3.3 V (hereinafter, denoted as "L").

In the first exemplary embodiment, the light-emitting device 65 is driven by a negative potential.

Since the p-type first semiconductor layer 81, which is the anode terminals of the thyristors, has the same potential as that of the p-type substrate 80, the potential of the anode terminals of the thyristors is the reference potential Vsub ("H" (0 V)) supplied to the backside electrode 85.

Each thyristor is configured by layering p-type semiconductor layers and n-type semiconductor layers based on GaAs, GaAlAs and the like, for example, as shown in FIG. 6B. A forward potential (diffusion potential) Vd of pn junction is assumed to be 1.5 V, as an example.

A thyristor in an OFF state where no current flows between the anode and cathode terminals shifts to an ON state (turns on), when a potential lower than a threshold voltage (a negative value greater in absolute value) is applied to the cathode terminal. The threshold voltage of the thyristor is the potential of the gate terminal minus the forward potential Vd (1.5 V) of pn junction. Thus, if the potential of the gate terminal is 0 V, the threshold voltage of the thyristor is −1.5 V. That is, when a potential lower than −1.5 V is applied to the cathode terminal, the thyristor gets turned on. The thyristor, when turned on, shifts to a state (the ON state) where a current flows between the anode and cathode terminals.

The gate terminal of the thyristor in the ON state has a potential close to the potential of the anode terminal thereof. Since the anode terminal is set to the reference potential Vsub (0 V ("H")) herein, the potential of the gate terminal is assumed to be 0 V ("H"). Meanwhile, the cathode terminal of the thyristor in the ON state has a potential close to the potential of the anode terminal minus the forward potential Vd of pn junction. Since the anode terminal is set to the reference potential Vsub (0 V ("H")) herein, the potential of the cathode terminal of the thyristor in the ON state is assumed to be −1.5 V.

Once the thyristor is turned on, the thyristor shifts to the OFF state (turns off) when the potential of the cathode terminal becomes higher than a potential required to maintain the ON state (a negative value smaller in absolute value, 0 V or a positive value), that is, when a potential higher than −1.5 V is applied to the cathode terminal. For example, when the cathode terminal becomes "H" (0 V), the potential is higher than −1.5 V and the potential of the cathode terminal becomes equal to that of the anode terminal. Thus, the thyristor gets turned off.

On the other hand, since the potential of the cathode terminal of the thyristor in the ON state is −1.5 V, the thyristor maintains the ON state as long as a potential lower than −1.5 V (a negative value greater in absolute value) is continuously applied to the cathode terminal to supply a current (a maintenance current) allowing the ON state of the thyristor to be maintained.

The light-emitting thyristor L lights up (emits light) when turned on, and is unlighted (does not light up) when turned off. The amount of light of the light-emitting thyristor L in the ON state depends on the area of the light-emitting region 311 and the current flowing between the cathode and anode terminals thereof.

<Timing Chart>

Figure 7:
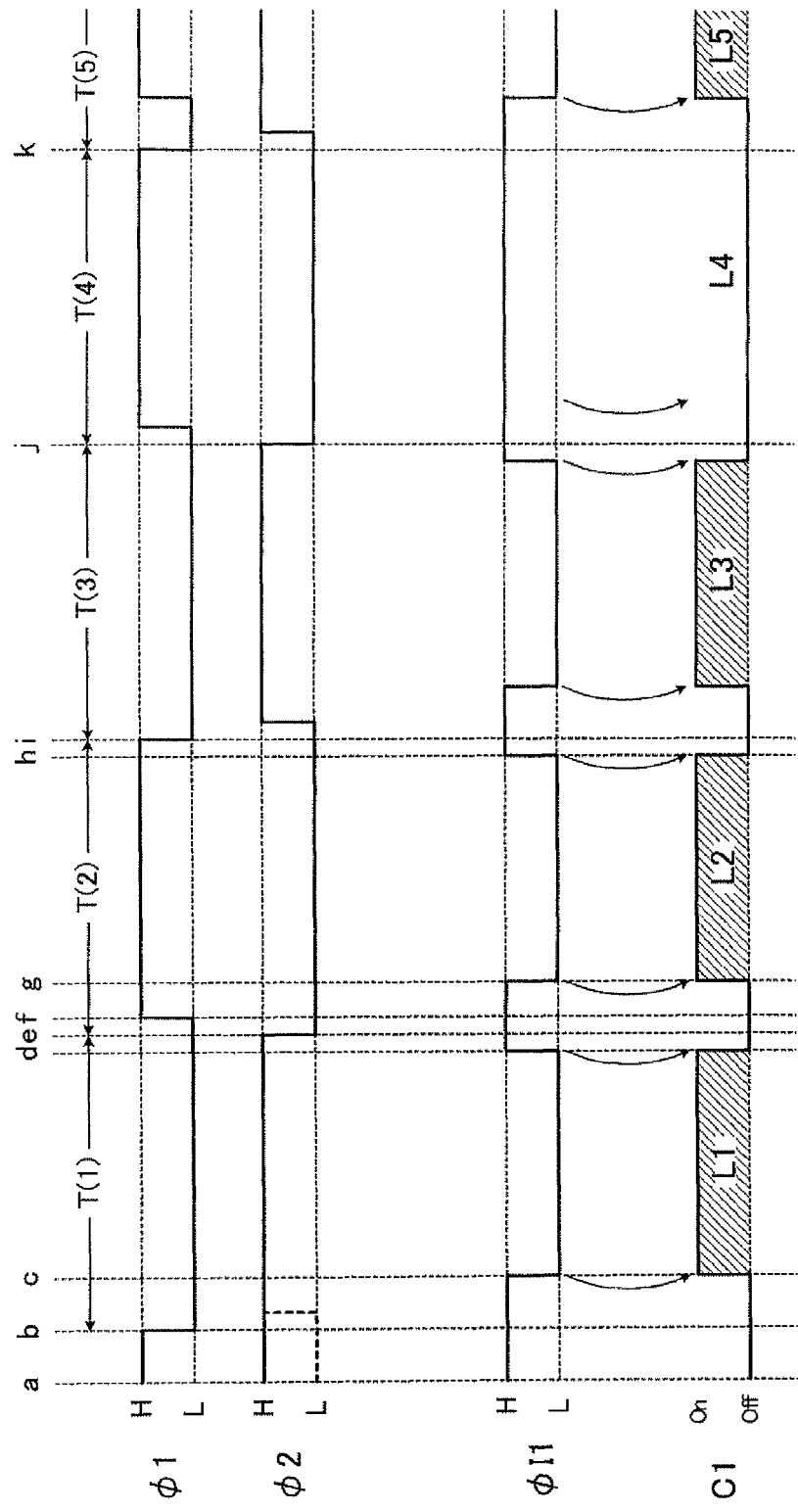
FIG. 7 is a timing chart for illustrating the operations of the light-emitting device and the light-emitting chip.

FIG. 7 is a timing chart for illustrating the operations of the light-emitting device 65 and the light-emitting chip C.

FIG. 7 shows a part of the timing chart in which five light-emitting thyristors L, namely, the light-emitting thyristors L1 to L5 of the light-emitting chip C1 are controlled to light up or not to light up (referred to as light-controlled). Since the other light-emitting chips C2 to C40 are driven in parallel with the light-emitting chip C1 as described above, it is only necessary here to describe the operation of the light-emitting chip C1.

Note that the light-emitting thyristors L1, L2, L3 and L5 of the light-emitting chip C1 are lighted up, while the light-emitting thyristor L4 is unlighted (does not light up).

In FIG. 7, time elapses in alphabetical order from a time point a to a time point k. The light-emitting thyristors L1, L2, L3 and L4 are controlled to light up or not to light up (light-controlled) during a time interval T(1) from a time point b to a time point e, a time interval T(2) from the time point e to a time point i, a time interval T(3) from the time point i to a time point j and a time interval T(4) from the time point j to the time point k, respectively. Then, the light-emitting thyristors L having 5 or larger indices are light-controlled in a similar manner.

In the first exemplary embodiment, the time intervals T(1), T(2), T(3) ... have the same length, and are referred to as time interval T when not separately distinguished.

Note that the length of the time intervals T(1), T(2), T(3) ... may be variable as long as a mutual relationship between signals described below is maintained.

The waveforms of the first transfer signal φ1, the second transfer signal φ2 and the light-up signal φI1 are described. The time interval from the time point a to the time point b is an interval for the light-emitting chip C1 (the same applies to the light-emitting chips C2 to C40) to start operating. The signals in this time interval will be described in the description of the operation below.

The first transfer signal φ1 transmitted to the φ1 terminal (see FIGS. 5 and 6A) and the second transfer signal φ2 transmitted to the φ2 terminal (see FIGS. 5 and 6A) are signals having two potentials of "H" and "L." The first transfer signal φ1 and the second transfer signal φ2 repeat the waveforms thereof with a period of two successive time intervals T (for example, the time intervals T(1) and T(2)).

The first transfer signal φ1 shifts from "H" to "L" at the start time point b of the time interval T(1), and shifts from "L" to "H" at a time point f. The first transfer signal φ1 then shifts from "H" to "L" at the end time point i of the time interval T(2).

The second transfer signal φ2 is "H" at the start time point b of the time interval T(1), and shifts from "H" to "L" at the time point e. The second transfer signal φ2 is maintained at "L" at the end time point i of the time interval T(2).

Now, comparing the first transfer signal φ1 with the second transfer signal φ2, the waveform of the second transfer signal φ2 corresponds to a waveform obtained by shifting that of the first transfer signal φ1 to a delayed point on a time axis by the time interval T.

The waveform of the first transfer signal φ1 in the time interval T(3) and afterward is a repetition of the waveform in the time intervals T(1) and T(2). On the other hand, the waveform of the second transfer signal φ2 in the time interval T(3) and afterward is a repetition of the waveform in the time interval T(1) indicated with a broken line and that in the time interval T(2). The waveform of the second transfer signal φ2 in the time interval T(1) is different from that in the time interval T(3) and afterward, because the time interval T(1) is an interval in which the light-emitting device 65 starts operating.

A pair of the transfer signals, namely, the first transfer signal φ1 and the second transfer signal φ2 causes the ON state of the transfer thyristors T shown in FIGS. 5 to 6B to propagate in numerical order as described below, thereby to designate each light-emitting thyristor L having the same index as the corresponding transfer thyristor T in the ON state as a control target for lighting up or not lighting up (to be light-controlled).

Next, the light-up signal φI1 transmitted to the φI terminal of the light-emitting chip C1 is described. The light-up signals φI2 to φI40 are respectively transmitted to the other light-emitting chips C2 to C40. The light-up signal φI1 is a signal having two potentials of "H" and "L."

Here, a description is given of the light-up signal φI1 in the time interval T(1) for light-up control on the light-emitting thyristor L1 of the light-emitting chip C1. Note that the light-emitting thyristor L1 is assumed to light up.

The light-up signal φI1 is "H" at the start time point b of the time interval T(1), and shifts from "H" to "L" at a time point c. The light-up signal φI1 then shifts from "L" to "H" at a time point d, and is maintained at "H" at the end time point e of the time interval T(1).

Now, the operations of the light-emitting device 65 and the light-emitting chip C1 are described according to the timing chart shown in FIG. 7 with reference to FIGS. 4A to 5. In the following, a description is given of the time intervals T(1) and T(2) for light-up control on the light-emitting thyristors L1 and L2.

(1) Time Point a

<Light-Emitting Device 65>

At the time point a, the reference potential supplying part 160 of the signal generating circuit 110 of the light-emitting device 65 sets the reference potential Vsub to "H" (0 V). The power supply potential supplying part 170 sets the power supply potential Vga to "L" (−3.3 V). Then, the power supply line 200a on the circuit board 62 of the light-emitting device 65 is set to the reference potential Vsub of "H" (0 V), and the Vsub terminals of the respective light-emitting chips C1 to C40 are set to "H." Similarly, the power supply line 200b is set to "L," and the Vga terminals of the respective light-emitting chips C1 to C40 are set to "L." Thereby, the power supply line 71 of each of the light-emitting chips C1 to C40 is set to "L."

The transfer signal generating part 120 of the signal generating circuit 110 sets both of the first transfer signal φ1 and the second transfer signal φ2 to "H." Then, the first transfer signal line 201 and the second transfer signal line 202 are set to "H" (see FIG. 4B). Thereby, the φ1 and φ2 terminals of each of the light-emitting chips C1 to C40 are set to "H." The potential of the first transfer signal line 72 connected to the φ1 terminal via the current limitation resistance R1 is also set to "H," and the potential of the second transfer signal line 73 connected to the φ2 terminal via the current limitation resistance R2 is also set to "H" (see FIG. 5).

Additionally, the light-up signal generating part 140 of the signal generating circuit 110 sets the light-up signals φI1 to φI40 to "H." Then, the light-up signal lines 204-1 to 204-40 are set to "H" (see FIG. 4B). Thereby, the φI terminal of each of the light-emitting chips C1 to C40 is set to "H" via the current limitation resistance RI. The light-up signal line 75 connected to the φI terminal is also set to "H" (see FIG. 5).

Next, the operation of the light-emitting chip C1 is described.

In FIG. 7 and the following description, the potential of each terminal is assumed to change in a step-like manner; however, the potential of each terminal actually changes gradually. Thus, even while the potential is changing, as long as the following conditions are satisfied, the thyristors may turn on or turn off to change their state.

<Light-Emitting Chip C1>

Since the anode terminals of the transfer thyristors T and the light-emitting thyristors L are connected to the Vsub terminal, these terminals are set to "H" (0 V).

The cathode terminals of the respective odd-numbered transfer thyristors T1, T3, T5 . . . are connected to the first transfer signal line 72 and are set to "H." The cathode terminals of the respective even-numbered transfer thyristors T2, T4, T6 . . . are connected to the second transfer signal line 73 and are set to "H." Thus, since both of the anode and cathode terminals are at "H," the transfer thyristors T are in the OFF state.

The cathode terminals of the light-emitting thyristors L are connected to the light-up signal line 75, which is set to "H." Thus, since both of the anode and cathode terminals are at "H," the light-emitting thyristors L are also in the OFF state.

The gate terminal Gt1 at one end of the transfer thyristor array in FIG. 5 is connected to the cathode terminal of the start diode Dx0 as described above. The gate terminal Gt1 is connected to the power supply line 71 of the power supply potential Vga ("L" (−3.3 V)) via the power supply line resistance Rgx1. The anode terminal of the start diode Dx0 is connected to the second transfer signal line 73, and is connected to the φ2 terminal of "H" (0 V) via the current limitation resistance R2. Thus, the start diode Dx0 is forward biased, and the potential of the cathode terminal (the gate terminal Gt1) of the start diode Dx0 is set to the value (−1.5 V) that is the potential ("H" (0 V)) of the anode terminal of the start diode Dx0 minus the forward potential Vd (1.5 V) of pn junction. Meanwhile, when the potential of the gate terminal Gt1 becomes −1.5 V, the coupling diode Dx1 becomes forward biased, because the potential of the anode terminal thereof (the gate terminal Gt1) is −1.5 V and the cathode terminal thereof is connected to the power supply line 71 ("L" (−3.3 V)) via the power supply line resistance Rgx2. Thus, the potential of the gate terminal Gt2 is set to −3 V that is the potential (−1.5 V) of the gate terminal Gt1 minus the forward potential Vd (1.5 V) of pn junction. However, the gate terminals Gt having 3 or larger indices are not affected by the anode terminal of the start diode Dx0 being set to "H" (0 V), and thus the potential of the gate terminals Gt is "L" (−3.3 V), which is the potential of the power supply line 71.

Since the gate terminals Gt are connected to the respective gate terminals Gl, the potentials of the gate terminals Gl are the same as those of the respective gate terminals Gt. Thus, the threshold voltages of the transfer thyristors T and the light-emitting thyristors L are the potentials of the respective gate terminals Gt and Gl minus the forward potential Vd (1.5 V) of pn junction. That is, the threshold voltage of the transfer thyristor T1 and the light-emitting thyristor L1 is −3 V; the threshold voltage of the transfer thyristor T2 and the light-emitting thyristor L2 is −4.5 V; and the threshold voltage of the transfer thyristors T and the light-emitting thyristors L having 3 or larger indices is −4.8 V.

(2) Time Point b

At the time point b shown in FIG. 7, the first transfer signal φ1 shifts from "H" (0 V) to "L" (−3.3 V). Thereby, the light-emitting device 65 starts operating.

When the first transfer signal φ1 shifts from "H" to "L," the potential of the first transfer signal line 72 shifts from "H" to "L" via the φ1 terminal and the current limitation resistance R1. Then, the transfer thyristor T1 with a threshold voltage of −3 V gets turned on. However, the odd-numbered transfer thyristors T having 3 or larger indices, whose cathode terminals are connected to the first transfer signal line 72, are not allowed to turn on because the threshold voltage thereof is −4.8 V. Additionally, the even-numbered transfer thyristors T are not allowed to turn on, because the second transfer signal φ2 is at "H" (0 V) and the potential of the second transfer signal line 73 is "H." Turning-on of the transfer thyristor T1 sets the potential of the first transfer signal line 72 to the value −1.5 V that is the potential ("H" (0 V)) of the anode terminal minus the forward potential Vd (1.5 V) of pn junction.

When the transfer thyristor T1 gets turned on, the potential of the gate terminal Gt1 becomes "H" (0 V), which is the potential of the anode terminal of the transfer thyristor T1. The potential of the gate terminal Gt2 becomes −1.5 V; the potential of the gate terminal Gt3 becomes −3 V; and the potential of the gate terminals Gt having 4 or larger indices become "L" (−3.3 V).

Thereby, the threshold voltage of the light-emitting thyristor L1 becomes −1.5 V; the threshold voltage of the transfer thyristor T2 and the light-emitting thyristor L2 becomes −3 V; the threshold voltage of the transfer thyristor T3 and the light-emitting thyristor L3 becomes −4.5 V; and the threshold voltage of the transfer thyristors T and the light-emitting thyristors L having 4 or larger indices becomes −4.8 V.

However, the odd-numbered transfer thyristors T in the OFF state do not get turned on because the potential of the first transfer signal line 72 is set to −1.5 V by the transfer thyristor T1 in the ON state. The even-numbered transfer thyristors T do not get turned on because the potential of the second transfer signal line 73 is "H." None of the light-emitting thyristors L do not get turned on because the potential of the light-up signal line 75 is "H."

Immediately after the time point b (here, referred to a time point when the thyristors are in a steady state after a change is made on a thyristor or the like due to a change of the potential of the signal at the time point b), the transfer thyristor T1 is in the ON state, while the other transfer thyristors T and the light-emitting thyristors L are in the OFF state.

(3) Time Point c

At the time point c, the light-up signal φI1 shifts from "H" to "L."

When the light-up signal φI1 shifts from "H" to "L," the potential of the light-up signal line 75 shifts from "H" to "L" via the current limitation resistance RI and the φI terminal. Then, the light-emitting thyristor L1 with a threshold voltage of −1.5 V gets turned on to light up (emit light). Thereby, the potential of the light-up signal line 75 becomes −1.5 V. Note that, although the threshold voltage of the light-emitting thyristor L2 is −3 V, the light-emitting thyristor L2 does not get turned on, because the light-emitting thyristor L1, which has a high threshold voltage of −1.5 V (a negative value having a small absolute value), gets turned on and thus the potential of the light-up signal line 75 becomes −1.5 V.

Immediately after the time point c, the transfer thyristor T1 is in the ON state, while the light-emitting thyristor L1 is in the ON state and lights up (emits light).

(4) Time Point d

At the time point d, the light-up signal φI1 shifts from "L" to "H."

When the light-up signal φI1 shifts from "L" to "H," the potential of the light-up signal line 75 shifts from "L" to "H" via the current limitation resistance RI and the φI terminal. Then, the light-emitting thyristor L1 gets turned off to be unlighted (not to light up) because the potential of both of the anode and cathode terminals becomes "H." The light-up period of the light-emitting thyristor L1 is a period from the time point c at which the light-up signal φI1 shifts from "H" to "L" to the time point d at which the light-up signal φI1 shifts from "L" to "H," namely, the period during which the light-up signal φI1 is "L."

Immediately after the time point d, the transfer thyristor T1 is in the ON state.

(5) Time Point e

At the time point e, the second transfer signal φ2 shifts from "H" to "L." Here, the time interval T(1) for light-up control on the light-emitting thyristor L1 is finished, and the time interval T(2) for light-up control on the light-emitting thyristor L2 is started.

When the second transfer signal φ2 shifts from "H" to "L," the potential of the second transfer signal line 73 shifts from "H" to "L" via the φ2 terminal. Since the transfer thyristor T2 has a threshold voltage of −3 V as described above, the transfer thyristor T2 gets turned on. Thereby, the potential of the gate terminal Gt2 (the gate terminal Gl2) becomes "H" (0 V); the potential of the gate terminal Gt3 (the gate terminal Gl3) becomes −1.5 V; the potential of the gate terminal Gt4 (the gate terminal Gl4) becomes −3 V. Additionally, the potential of the gate terminals Gt (the gate terminals Gl) having 5 or larger indices becomes −3.3 V.

Immediately after the time point e, the transfer thyristors T1 and T2 are in the ON state.

(6) Time Point f

At the time point f, the first transfer signal φ1 shifts from "L" to "H."

When the first transfer signal φ1 shifts from "L" to "H," the potential of the first transfer signal line 72 shifts from "L" to "H" via the φ1 terminal. Then, the transfer thyristor T1 in the ON state gets turned off because the potential of both of the anode and cathode terminals becomes "H." Then, the potential of the gate terminal Gt1 (Gl1) changes toward the power supply potential Vga ("L" (−3.3 V)) of the power supply line 71 via the power supply line resistance Rgx1. Thereby, the coupling diode Dx1 becomes in a state (reverse biased) where a potential is applied so that a current does not flow therethrough. Thus, the gate terminal Gt1 (the gate terminal Gl1) is no longer affected by the gate terminal Gt2 (the gate terminal Gl2) being set to "H" (0 V). That is, the transfer thyristor T having the gate terminal Gt connected to the reverse biased coupling diode Dx has a threshold voltage of −4.8 V, and thus does not get turned on by the first transfer signal φ1 or the second transfer signal φ2 at "L" (−3.3 V).

Immediately after the time point f, the transfer thyristor T2 is in the ON state.

(7) Other Time points

At a time point g, the light-up signal φI1 shifts from "H" to "L," and then the light-emitting thyristor L2 gets turned on to light up (emit light) as with the light-emitting thyristor L1 at the time point c.

At a time point h, the light-up signal φI1 shifts from "L" to "H," and then the light-emitting thyristor L2 gets turned off to be unlighted as with the light-emitting thyristor L1 at the time point d.

Furthermore, at the time point i, the first transfer signal φ1 shifts from "H" to "L," and then the transfer thyristor T3 with a threshold voltage of −3 V gets turned on as with the transfer thyristor T1 at the time point b or the transfer thyristor T2 at the time point e. At the time point i, the time interval T(2) for light-up control on the light-emitting thyristor L2 is finished, and the time interval T(3) for light-up control on the light-emitting thyristor L3 is started.

After that, the same operation as has been described is repeated.

If some light-emitting thyristors L are not caused to light up (emit light) but remain unlighted (not lighted up), it is only necessary to maintain the light-up signals φI at "H" (0 V) as with the light-up signal φI1 in the time interval T(4) from the time point j to the time point k shown in FIG. 7 for light-up control on the light-emitting thyristor L4. By this operation, even if the threshold voltage of the light-emitting thyristor L4 is −1.5 V, the light-emitting thyristor L4 remains unlighted (not lighted up).

As described above, the gate terminals Gt of the transfer thyristors T are mutually connected to each other via the coupling diodes Dx. Therefore, when the potential of a certain terminal Gt is changed, the potentials of other gate terminals Gt connected to the certain gate terminal Gt via the forward biased coupling diode Dx are changed. The threshold voltage of the transfer thyristor T having the certain gate terminal Gt is then changed. If the threshold voltage is higher than "L" (−3.3 V) (a negative value having a small absolute value), the transfer thyristor T gets turned on at timing when the first transfer signal φ1 or the second transfer signal φ2 shifts from "H" (0 V) to "L" (−3.3 V).

Then, the light-emitting thyristor L whose gate terminal Gl is connected to the gate terminal Gt of the transfer thyristor T in the ON state has a threshold voltage of −1.5 V, and thus gets turned on to light up (emit light) when the light-up signal φI shifts from "H" to "L."

That is, the transfer thyristor T, when changing to the ON state, designates the light-emitting thyristor L that is a target for light-up control, while the light-up signal φI causes the light-emitting thyristor L being a target for light-up control to light up or not to light up.

In this manner, the waveform of each light-up signal φI is set in accordance with image data, and thereby lighting up and not lighting up of the light-emitting thyristors L are controlled.

Next, the light-emitting portion 102 is described in detail.

FIGS. 8A to 8C are views for illustrating the structure of the light-emitting portion 102 of the light-emitting chip C in the first exemplary embodiment. FIG. 8A is a plan view of the light-emitting portion 102; FIG. 8B is a cross-sectional view taken along the line VIIIB-VIIIB of FIG. 8A; and FIG. 8C is a cross-sectional view taken along the line VIIIC-VIIIC of FIG. 8A. A portion including four adjacent light-emitting thyristors L in the light-emitting thyristor array is shown here. The surface of the light-emitting region 311 of each light-emitting thyristor L has a rectangular shape, and the shorter direction thereof is in the direction of the light-emitting thyristor array while the longer direction thereof is in the direction orthogonal to the light-emitting thyristor array. For example, the length in the shorter direction of the light-emitting region 311 is 16.5 μm, and the length in the longer direction thereof is 30 μm.

In the first exemplary embodiment, each of the light-emitting regions 311 of the light-emitting thyristors L in the light-emitting thyristor array forming the light-emitting portion 102, is surrounded by the two primary portions 75a and the two secondary portions 75c of the light-up signal line 75. Each of the connecting portions 75d connects one of the two secondary portions 75c (in FIG. 8A, the secondary portion 75c on the left side of each light-emitting region 311) with the n-type ohmic electrode 321 provided on the light-emitting region 311. That is, the connecting portions 75d are provided so as to extend in the array direction of the light-emitting thyristor array.

The secondary portions 75c are provided in isolation trenches between the light-emitting regions 311 of every adjacent pair of the light-emitting thyristors L.

Here, a description is given of the light-up signal line 75 having the connecting portions 75d provided so as to extend in the array direction of the light-emitting thyristor array, in the first exemplary embodiment.

FIGS. 9A to 9D are views illustrating a case where the connecting portions 75d of the light-up signal line 75 are provided so as to extend in the array direction of the light-emitting thyristor array compared with a case where those are provided so as to extend in the direction orthogonal to the array direction of the light-emitting thyristor array. FIGS. 9A and 9B are views illustrating the case where the connecting portions 75d of the light-up signal line 75 are provided so as to extend in the array direction of the light-emitting thyristor array, while FIGS. 9C and 9D are views illustrating the case the connecting portions 75d of the light-up signal line 75 are provided so as to extend in the direction orthogonal to the array direction of the light-emitting thyristor array. In either case, the n-type ohmic electrodes 321 are respectively provided in center portions of the light-emitting regions 311.

FIGS. 9A to 9D show the light-emitting regions 311 of two of the light-emitting thyristors L and the primary portions 75a, the secondary portions 75c and the connecting portions 75d of the light-up signal line 75 to supply a current for emitting light to the two light-emitting thyristors L. Here, the connecting portions 75d are described, in order to explain that the connecting portions 75d are provided so as to extend in the array direction of the light-emitting thyristor array.

In the light-emitting chip C, the light-emitting thyristors L are arrayed in line, and a pitch P (see FIG. 8A) of the light-emitting thyristors L is determined according to the resolution (print pitch) of the print head 14. For example, if the print pitch is 1200 dpi (the number of dots per 1 inch), the pitch P of the light-emitting thyristors L is determined as 21.16 μm. In general, a width (isolation trench width) Wt of a trench between those islands (the first island 301 in FIG. 6) formed by mesa etching which are provided with the light-emitting thyristors L is set to as a small dimension as possible (for example, 5 μm) with processing techniques. For this reason, it is difficult to narrow the isolation trench width Wt to increase the area of the light-emitting regions 311 for the purpose of increasing the amount of light of the light-emitting thyristors L.

In contrast, it is easy to widen the light-emitting regions 311 in the direction orthogonal to the light-emitting thyristor array (in the second scanning direction, which is the Y direction shown in FIG. 4B), like an expansion from 30 μm to 35 μm, for example.

On this occasion, if the connecting portions 75d of the light-up signal line 75 are provided so as to extend in the array direction of the light-emitting thyristor array, the area of the light-emitting regions 311 whose light is blocked by the connecting portions 75d does not vary even when each light-emitting region 311 is formed into a rectangular shape whose longer direction is in the direction orthogonal to the light-emitting thyristor array as shown in FIGS. 9A and 9B. That is, when each light-emitting region 311 is formed into a rectangular shape whose longer direction is in the direction orthogonal to the light-emitting thyristor array, the area of the light-emitting regions 311 whose light is blocked by the connecting portions 75d is small. Thus, an increase of the area of the light-emitting regions 311 is reflected in an increase of the amount of light with a high degree of efficiency.

On the other hand, if the connecting portions 75d of the light-up signal line 75 are provided so as to extend in the direction orthogonal to the light-emitting thyristor array, an expansion of each light-emitting region 311 in the direction orthogonal to the light-emitting thyristor array as shown in FIGS. 9C and 9D requires an extension of the length of the connecting portions 75d, which results in an increase of the area of the light-emitting regions 311 whose light is blocked by the connecting portions 75d. That is, when each light-emitting region 311 is formed into a rectangular shape whose longer direction is in the direction orthogonal to the light-emitting thyristor array, the area of the light-emitting regions 311 whose light is blocked by the connecting portions 75*d* increases. Thus, an increase of the area of the light-emitting regions 311 does not lead to an increase of the amount of light with a high degree of efficiency.

At the periphery of the light-emitting regions 311, non-radiative recombination involving no light emission is likely to occur. For this reason, the position of each n-type ohmic electrode 321 may be the center portion of the light-emitting region 311; however, another position may be acceptable as long as the n-type ohmic electrode 321 is located in such a position that the area whose light is blocked by the connecting portions 75*d* is small as compared with a case where each connecting portion 75*d* is provided in the longer direction of the light-emitting region 311 either the array direction of the light-emitting thyristor array or the direction orthogonal to the array direction.

The first exemplary embodiment discloses the configuration in which each connecting portion 75*d* extends parallel to the shorter direction of the light-emitting region 311 either the array direction of the light-emitting thyristor array or the direction orthogonal to the array direction, as a configuration of the connecting portion 75*d* along the shorter direction; however, the configuration of the connecting portion 75*d* along the shorter direction of the light-emitting region 311 is not limited thereto, but another configuration in which each connecting portion 75*d* curves or extends obliquely with respect to the shorter direction may be acceptable as long as the configuration makes the area whose light is blocked small as compared with a case where each connecting portion 75*d* is provided in the longer direction of the light-emitting region 311. However, it is not preferable to provide the connecting portions 75*d* at the periphery of the light-emitting regions 311.

Next, returning to FIGS. 8A to 8C, steps formed in the isolation trenches are described.

In a compound semiconductor, such as GaAs and GaAlAs, there is known that an isolation trench formed by mesa etching includes a forward mesa step portion 92 whose side surface has a smooth shape (the slopes of tangent lines thereof have the same sign), and a reverse mesa step portion 93 whose side surface has an overhang shape, depending on the crystal orientation. FIG. 8B shows the forward mesa step portion 92, while FIG. 8C shows the reverse mesa step portion 93. When the forward mesa step portion 92 and the reverse mesa step portion 93 are not separately distinguished, the side surface of an isolation trench is referred to as mesa step portion.

If an interconnection material, such as aluminum and aluminum alloy, is formed on the reverse mesa step portion 93 by a physical method, such as a sputtering method and a vacuum deposition method, the backside of the overhang-shaped step is shadowed (shadow effect), which tends to reduce a ratio of film formation of the interconnection material and thus reduce an effective film thickness (the primary portion 75*a* in FIG. 8C). For this reason, an interconnection provided over the reverse mesa step portion 93 is likely to have disconnection (disconnection due to step difference) at the step portion. On the other hand, at the forward mesa step portion 92, the shadow effect is unlikely to occur, and the disconnection due to step difference is prevented in an interconnection provided over the forward mesa step portion 92. The shape of the light-up signal line 75 that has not been subjected to processing is indicated with broken lines in FIGS. 8B and 8C.

As described above, the interconnections, such as the power supply line 71, the first transfer signal line 72, the second transfer signal line 73 and the light-up signal line 75, are provided so as to extend in the array direction of the light-emitting thyristor array (the longer direction of substrate 80) as shown in FIGS. 4A, 5 and 6A.

These interconnections are formed so as to straddle plural islands, as shown in FIG. 6A. For example, if the number of the light-emitting thyristors L is 128, these interconnections are provided over 256 steps. Thus, in order to prevent disconnection due to step difference, the crystal orientation of the substrate 80 is selected so that these interconnections are provided over the forward mesa step portions 92. That is, the forward mesa step portions 92 appear in the direction of the light-emitting thyristor array as shown in FIG. 8B, while the reverse mesa step portions 93 appear in the direction orthogonal to the light-emitting thyristor array as shown in FIG. 8C.

In the first exemplary embodiment, the connecting portions 75*d* are provided so as to extend in the array direction of the light-emitting thyristor array. That is, the connecting portions 75*d* are provided in the direction over the forward mesa step portions 92. Thus, disconnection due to step difference is prevented also in the connecting portions 75*d*.

A description is given of the edges of the secondary portions 75*c* of the light-up signal line 75 provided so as to be in contact with those of the light-emitting regions 311, as shown in the cross-sectional view of FIG. 8B taken along the line VIIIB-VIIIB.

As described above, when the print pitch is 1200 dpi, the pitch P of the light-emitting thyristors L is 21.16 μm. Then, for example, if the isolation trench width Wt is set to 4.6 μm and an interconnection width W1 of the secondary portions 75*c* of the light-up signal line 75 is set to 4.6 μm, the isolation trench width Wt is equal to the interconnection width W1.

Then, the secondary portions 75*c* of the light-up signal line 75 are provided so as to fill the isolation trenches, and the edges of the secondary portions 75*c* of the light-up signal line 75 are provided so as to be in contact with those of the light-emitting regions 311. Additionally, each of side surfaces 75*e* of the secondary portions 75*c* has an arc-shaped cross section so that the side surface 75*e* becomes wider as the distance from the light-emitting region 311 is getting longer.

The light beams captured in the rod lens array 64 among those emitted from the light-emitting regions 311 expose the photoconductive drum 12. However, some light beams (rejected light beams) are emitted from the light-emitting regions 311 in an oblique direction with respect to the light-emitting regions 311, and are not captured in the rod lens array 64.

Accordingly, if each of the side surfaces 75*e* of the secondary portions 75*c* has an arc-shaped (concave) cross section as show in FIG. 8B, light beams traveling in an oblique direction (for example, in the direction of an arrow D) with respect to the direction perpendicular to the light-emitting regions 311 reflect on the side surfaces 75*e* and are then captured in the rod lens array 64 (turn to the direction of an arrow C, for example, orthogonal to the light-emitting regions 311).

On the other hand, the edges of the primary portions 75*a* are also provided so as to be in contact with those of the light-emitting regions 311 as shown in FIG. 8C. Also on the side surfaces 75*e* of the primary portions 75*a*, as with those of the secondary portions 75*c*, light beams traveling in an oblique direction (for example, in the direction of an arrow E) with respect to the direction perpendicular to the light-emitting regions 311 reflect and are then captured in the rod lens array 64 (turn to the direction of the arrow C, for example, orthogonal to the light-emitting regions 311).

As described above, in the first exemplary embodiment, the edges of the light-emitting regions 311 are in contact with those of the light-up signal line 75 (the primary portions 75a and the secondary portions 75c). Additionally, light beams emitted from the light-emitting regions 311 in an oblique direction with respect to the light-emitting regions 311 are reflected by using the side surfaces 75e of the light-up signal line 75 (the primary portions 75a and the secondary portions 75c) as reflecting surfaces (mirrors).

For example, aluminum or aluminum alloy is used as the interconnection material of the light-up signal line 75. If such an interconnection material is subjected to etching by use of acid or the like, etching proceeds (side etching), from the edge of a etch stop film (etch mask) such as a resist, in the lateral direction (the underside of the etch mask) as well as in the direction of the film thickness of the interconnection material. As a result, each side surface 75e of the interconnection material having been etched has an arc-shape with a center at the edge of the etch mask. Thus, setting the width of the etch mask in consideration of the width of side etching (the amount of side etching) allows the edges of the light-up signal line 75 (the primary portions 75a and the secondary portions 75c) to be in contact with those of the light-emitting regions 311, and allows the side surfaces 75e of the light-up signal line 75 (the primary portions 75a and the secondary portions 75c) to be processed into an arc-shape. That is, if the side surfaces 75e of the light-up signal line 75 (the primary portions 75a and the secondary portions 75c) are processed into an arc-shape as described above in the etching process for forming the interconnections, the reflection surfaces may be formed without providing a new process; however, the side surfaces 75e may be processed into an arc-shape in a process different from the etching process for forming the interconnections as long as the side surfaces 75e are finally processed into an arc-shape.

Note that the side surfaces 75e of the light-up signal line 75 (the primary portions 75a and the secondary portions 75c) may be planar or convex, for example, instead of an arc-shape (concave), and only need to be capable of reflecting light from the light-emitting regions 311 and contributing to an increase of the amount of light.

Additionally, since the light-up signal line 75 of the first exemplary embodiment has both of the two primary portions 75a provided so as to extend in the array direction of the light-emitting thyristor array, the width of the interconnection is effectively widened and thus the electrical resistance of the light-up signal line 75 is reduced, as compared with a case where only one of the primary portions 75a are used.

[Second Exemplary Embodiment]

In the second exemplary embodiment, the light-up signal line 75 of the light-emitting chip C is configured so as not to surround the light-emitting regions 311, unlike the first exemplary embodiment. In the other respects, the configuration is similar to that of the first exemplary embodiment. Thus, only the different portions will be described, and the same reference numerals are given to the similar portions, whose detailed description is omitted.

Figure 10A:
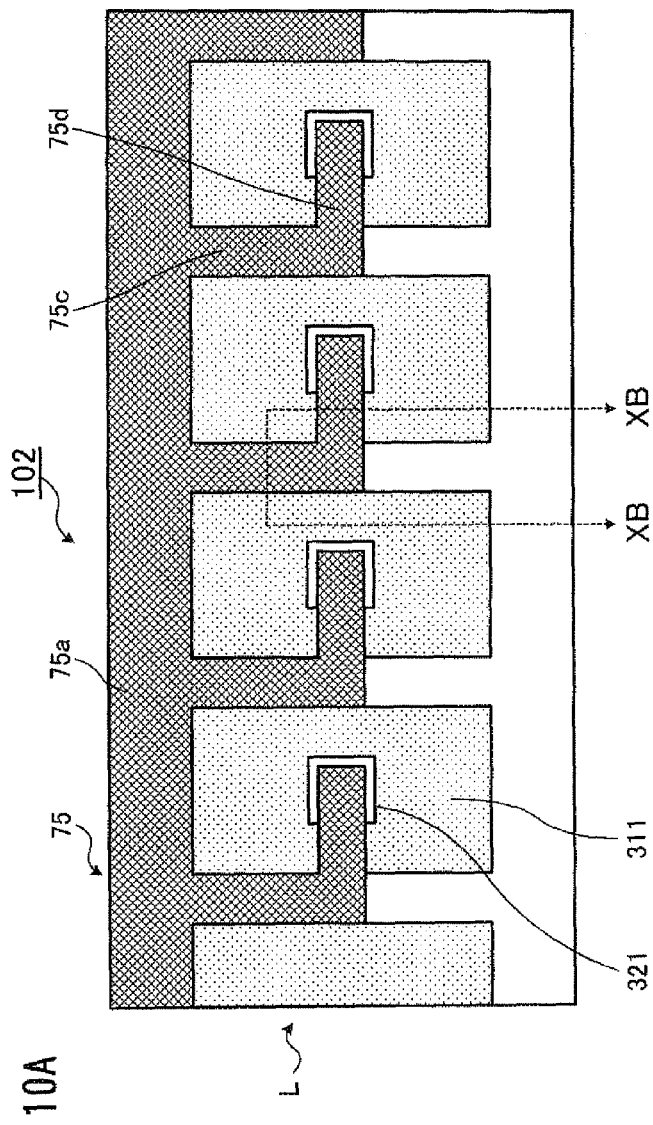
FIGS. 10A and 10B are views for illustrating the structure of the light-emitting portion of the light-emitting chip in the second exemplary embodiment.
Figure 10B:
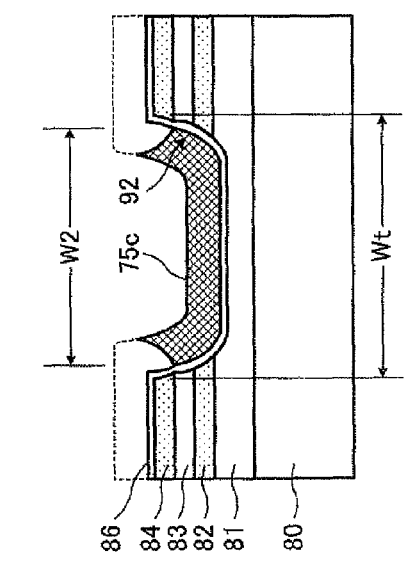

FIGS. 10A and 10B are views for illustrating the structure of the light-emitting portion 102 of the light-emitting chip C in the second exemplary embodiment. FIG. 10A is a plan view of the light-emitting portion 102; and FIG. 10B is a cross-sectional view taken along the line XB-XB of FIG. 10A. A portion including four adjacent light-emitting thyristors L in the light-emitting thyristor array is shown here. The surface of the light-emitting region 311 of each light-emitting thyristor L has a rectangular shape, and the shorter direction thereof is in the direction of the light-emitting thyristor array while the longer direction thereof is in the direction orthogonal to the light-emitting thyristor array. For example, the length in the shorter direction of the light-emitting region 311 is 16.5 µm, and the length in the longer direction thereof is 30 µm.

The light-up signal line 75 of the light-emitting chip C of the second exemplary embodiment has an L shape including: a primary portion 75a; secondary portions 75c branching from the primary portion 75a; and connecting portions 75d connecting the secondary portions 75c with the n-type ohmic electrodes 321 provided on the surfaces of the respective light-emitting regions 311. Note that the light-up signal line 75 of the light-emitting chip C of the second exemplary embodiment has one primary portion 75a.

The primary portion 75a of the light-up signal line 75 is provided along the edges of the light-emitting regions 311 of the light-emitting thyristors L, while the secondary portions 75c are provided in the isolation trenches between the light-emitting regions 311 separating the light-emitting thyristors L from each other.

For example, if the isolation trench width Wt is set to 5 µm and an interconnection width W2 of the secondary portions 75c of the light-up signal line 75 is set to 4.5 µm, the isolation trench width Wt is larger than the interconnection width W2. Then, as shown in FIG. 10B, the secondary portions 75c of the light-up signal line 75 are provided in the respective isolation trenches, and the edges of the secondary portions 75c are not in contact with those of the light-emitting regions 311 and each have a shape whose reflecting surface rises from the forward mesa step portion 92 (the mesa step portion). Similarly, the edges of the primary portion 75a of the light-up signal line 75 each have a shape so as not to be in contact with the edges of the light-emitting regions 311, which are not shown.

The shape of the cross section of the light-up signal line 75 (the secondary portions 75c) that has not been subjected to processing is indicated with broken lines in FIG. 10B.

Since the light-up signal line 75 of the second exemplary embodiment does not surround the light-emitting regions 311, even if the light-up signal line 75 is formed so as to be displaced inside of the light-emitting regions 311 with respect to a predetermined position, the area whose light is blocked by a part of the light-up signal line 75 (the primary portion 75a and the secondary portions 75c) covering the light-emitting regions 311 is small as compared with the first exemplary embodiment.

Additionally, in the second exemplary embodiment, the interconnection width W2 of the secondary portions 75c of the light-up signal line 75 is set narrower than the isolation trench width Wt as shown in FIG. 10B, and thereby the edges of the primary portion 75a and the secondary portions 75c are formed so as not to be in contact with those of the light-emitting regions 311. By this configuration, even if the light-up signal line 75 is formed so as to be displaced inside of the light-emitting regions 311 with respect to a predetermined position, the area whose light is blocked by the light-up signal line 75 covering the light-emitting regions 311 is reduced.

Note that the amount of light captured in the rod lens array 64 may be increased by using the mirror effect obtained by forming the primary portion 75a and the secondary portions 75c so that the primary portion 75a and the secondary portions 75c are in contact with the edges of the light-emitting regions 311 and each of side surfaces 75e thereof is in an arc-shape, as in the first exemplary embodiment.

[Third Exemplary Embodiment]

In the third exemplary embodiment, secondary portions 75c of the light-up signal line 75 of the light-emitting chip C are configured in common to the light-emitting regions 311 of respective pairs of the light-emitting thyristors L each composed of two adjacent light-emitting thyristors L. In the other respects, the configuration is similar to that of the second exemplary embodiment. Thus, only the different portions will be described, and the same reference numerals are given to the similar portions, whose detailed description is omitted.

Figure 11A:
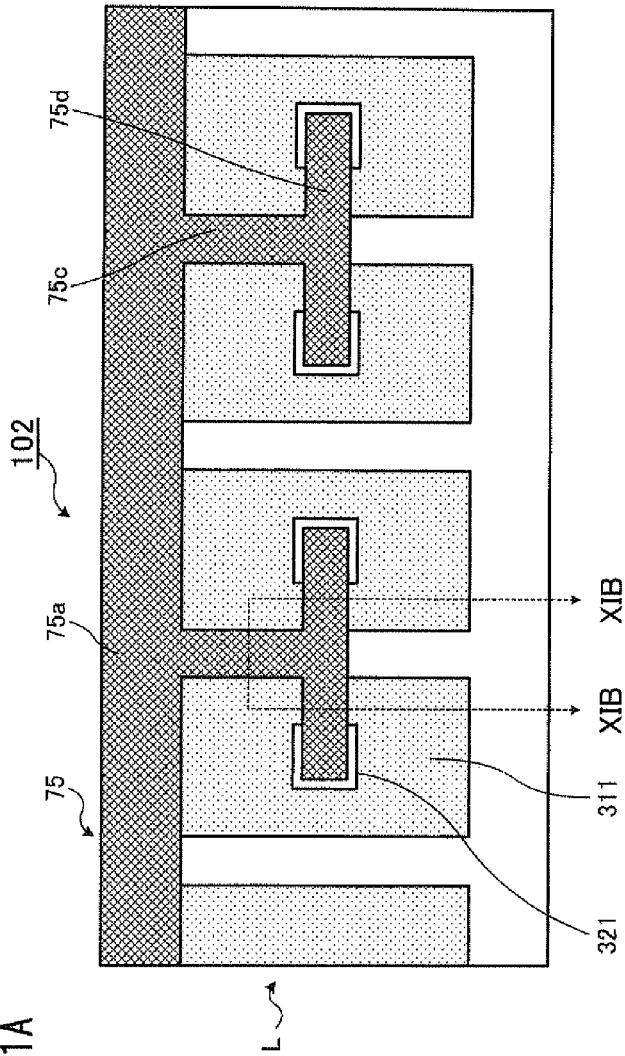
FIGS. 11A and 11B are views for illustrating the structure of the light-emitting portion of the light-emitting chip in the third exemplary embodiment.
Figure 11B:
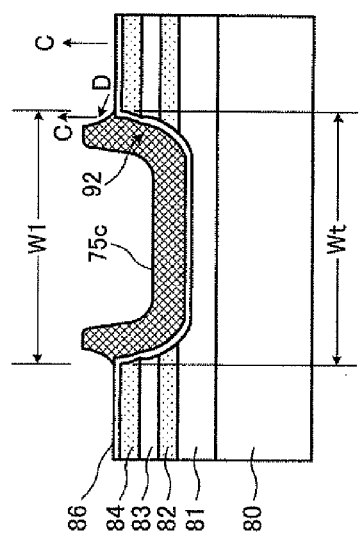

FIGS. 11A and 11B are views for illustrating the structure of the light-emitting portion 102 of the light-emitting chip C in the third exemplary embodiment. FIG. 11A is a plan view of the light-emitting portion 102; and FIG. 11B is a cross-sectional view taken along the line XIB-XIB of FIG. 11A. A portion including four adjacent light-emitting thyristors L in the light-emitting thyristor array is shown here. The surface of the light-emitting region 311 of each light-emitting thyristor L has a rectangular shape, and the shorter direction thereof is in the direction of the light-emitting thyristor array while the longer direction thereof is in the direction orthogonal to the light-emitting thyristor array. For example, the length in the shorter direction of the light-emitting region 311 is 16.5 μm, and the length in the longer direction thereof is 30 μm.

The light-up signal line 75 of the light-emitting chip C of the third exemplary embodiment includes: a primary portion 75a; the secondary portions 75c branching from the primary portion 75a; and connecting portions 75d connecting the secondary portions 75c with the n-type ohmic electrodes 321 of the respective light-emitting regions 311.

The primary portion 75a of the light-up signal line 75 is provided along the edges of the light-emitting regions 311 so as to extend in the array direction of the light-emitting thyristor array. Additionally, the secondary portions 75c of the light-up signal line 75 are provided so as to be located in the isolation trenches of the light-emitting regions 311 of the light-emitting thyristors L. For example, the isolation trench width Wt is set to 4.6 μm and the interconnection width W1 of the secondary portions 75c of the light-up signal line 75 is set to 4.6 μm. Thereby, the isolation trench width Wt is equal to the interconnection width W1, as in the first exemplary embodiment. By this configuration, the edges of the secondary portions 75c of the light-up signal line 75 are provided so as to be in contact with those of the light-emitting regions 311. Additionally, each of side surfaces 75e of the secondary portions 75c has an arc-shaped cross section so that the side surface 75e becomes wider as the distance from the light-emitting region 311 is getting longer.

The connecting portions 75d are provided so as to extend in the light-emitting thyristor array, as in the first and second exemplary embodiments. In the third exemplary embodiment, the secondary portions 75c of the light-up signal line 75 are provided in common to respective pairs of two adjacent light-emitting regions 311. Thus, the connecting portions 75d are provided extending from the secondary portions 75c to the left and right in FIG. 11A so as to extend in the array direction of the light-emitting thyristor array.

Furthermore, since the secondary portions 75c of the light-up signal line 75 of the third exemplary embodiment are provided in common to respective pairs of two adjacent light-emitting regions 311, even if the light-up signal line 75 is formed wider than a predetermined width and thereby the secondary portions 75c cover the light-emitting regions 311, only a part of the edges of the respective light-emitting regions 311 are covered. Even if the shape of the light-up signal line 75 varies in this manner, decrease in the amount of light is prevented.

In the third exemplary embodiment, the edges of the secondary portions 75c (the same applies to the primary portion 75a) of the light-up signal line 75 are provided so as to be in contact with those of the light-emitting regions 311, as shown in FIG. 11B. The amount of light captured in the rod lens array 64 is increased by forming the shape of the cross section of each side surface 75e of the light-up signal line 75 in an arc-shape. Note that the interconnection width W1 of the secondary portions 75c of the light-up signal line 75 may be set narrower than the isolation trench width Wt, as in the second exemplary embodiment.

Furthermore, in the third exemplary embodiment, two primary portions 75a may be provided, and these two primary portions 75a may be connected with each other through the secondary portions 75c. By this configuration, the electrical resistance of the light-up signal line 75 may be reduced.

The size of the light-emitting regions 311, the isolation trench width Wt and the widths W1 and W2 of the secondary portions 75c of the light-up signal line 75 shown in the first to third exemplary embodiments are only an example, and may be set to other values.

In the first to third exemplary embodiments, the shape of the light-emitting regions 311 is "rectangular," but may be "diamond-shaped" or "elliptic," for example, instead of "rectangular" as long as the shape has the length in the direction orthogonal to the array direction of the array of the light-emitting thyristors L longer than the length in the array direction.

The values of the high level potential "H" and the low level potential "L" shown in the first to third exemplary embodiments are only an example. These potentials may be set to other values in consideration of the operation of the light-emitting device 65.

In the first to third exemplary embodiments, the transfer thyristors T are driven by the first transfer signal φ1 and the second transfer signal φ2 in two phases; however, the transfer thyristors T may be driven by transmitting transfer signals in three phases for every three transfer thyristors T.

In the first to third exemplary embodiments, each light-emitting chip C is assumed to be mounted with one self-scanning light-emitting device array (SLED); however, the number of the SLEDs may be two or more. If two or more SLEDs are mounted, the light-emitting chip C may be substituted for each of the self-scanning light-emitting device arrays (SLEDs).

In the first to third exemplary embodiments, the description has been given of the anode common thyristors (the transfer thyristors T and the light-emitting thyristors L) whose anode terminals are commonly set as the substrate 80. The cathode common thyristors whose cathode terminals are set as the substrate 80 may be used instead by changing the polarity of the circuit.

Furthermore, in the first to third exemplary embodiments, the description has been given assuming the light-emitting elements to be the light-emitting thyristors L. However, the light-emitting elements may be light-emitting diodes or other light-emitting elements provided with interconnections on the light-emitting regions thereof.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light-emitting chip comprising:
a substrate;
a plurality of light-emitting elements arrayed in line on the substrate, each of the light-emitting elements including a light-emitting region having a length in an array direction of the array different from a length in a direction orthogonal to the array direction; and
a light-up current supplying interconnection including a plurality of connecting portions, each of the connecting portions being provided on the light-emitting region of a corresponding one of the light-emitting elements in a shorter direction of the light-emitting region either the array direction or the direction orthogonal to the array direction, each of the connecting portions being connected to an electrode provided on the light-emitting region, the light-up current supplying interconnection supplying a current for lighting up to the plurality of light-emitting elements through the plurality of connecting portions, wherein
each of the plurality of light-emitting elements is isolated by a trench with a mesa structure, a longer direction of the light-emitting region being orthogonal to a shorter direction of the light-emitting region, the mesa structure including a forward mesa step extending in the longer direction of the light emitting region and the mesa structure including a reverse mesa step extending in the shorter direction of the light emitting region, and
the light-up current supplying interconnection is arranged adjacent to the light-emitting region of each of the light-emitting elements, and has a reflecting surface reflecting light emitted with a spread so that the light is narrowed toward a direction perpendicular to the light-emitting region and in a direction away from the light-emitting elements.

2. The light-emitting chip according to claim 1, wherein the light-emitting region of each of the light-emitting elements has the length in the direction orthogonal to the array direction of the array longer than the length in the array direction,
the light-up current supplying interconnection includes a primary portion extending in the array direction and a plurality of secondary portions branching from the primary portion, and
the plurality of connecting portions included in the light-up current supplying interconnection are respectively connected to the plurality of secondary portions, and provided in the array direction of the array.

3. The light-emitting chip according to claim 2, wherein the plurality of secondary portions are provided for respective pairs each composed of two adjacent light-emitting elements of the plurality of light-emitting elements.

4. The light-emitting chip according to claim 2, wherein the primary portion and the plurality of connecting portions of the light-up current supplying interconnection are provided so as to cross the respective forward mesa step portions of the trenches isolating the plurality of light-emitting elements from each other.

5. The light-emitting chip according to claim 3, wherein the primary portion and the plurality of connecting portions of the light-up current supplying interconnection are provided so as to cross the respective forward mesa step portions of the trenches isolating the plurality of light-emitting elements from each other.

6. The light-emitting chip according to claim 2, wherein each of those edges of the primary portion and the plurality of secondary portions of the light-up current supplying interconnection has a reflecting surface facing a corresponding one of the plurality of light-emitting elements, the reflecting surface reflecting light emitted with a spread of the corresponding one of the light-emitting elements so that the light is narrowed toward a direction perpendicular to the light-emitting region and in a direction away from the light-emitting elements.

7. The light-emitting chip according to claim 3, wherein each of those edges of the primary portion and the plurality of secondary portions of the light-up current supplying interconnection has a reflecting surface facing a corresponding one of the plurality of light-emitting elements, the reflecting surface reflecting light emitted with a spread of the corresponding one of the light-emitting elements so that the light is narrowed toward a direction perpendicular to the light-emitting region and in a direction away from the light-emitting elements.

8. The light-emitting chip according to claim 4, wherein each of those edges of the primary portion and the plurality of secondary portions of the light-up current supplying interconnection has a reflecting surface facing a corresponding one of the plurality of light-emitting elements, the reflecting surface reflecting light emitted with a spread of the corresponding one of the light-emitting elements so that the light is narrowed toward a direction perpendicular to the light-emitting region and in a direction away from the light-emitting elements.

9. The light-emitting chip according to claim 5, wherein each of those edges of the primary portion and the plurality of secondary portions of the light-up current supplying interconnection has a reflecting surface facing a corresponding one of the plurality of light-emitting elements, the reflecting surface reflecting light emitted with a spread of the corresponding one of the light-emitting elements so that the light is narrowed toward a direction perpendicular to the light-emitting region and in a direction away from the light-emitting elements.

10. The light-emitting chip according to claim 2, wherein each of those edges of the primary portion and the plurality of secondary portions of the light-up current supplying interconnection has a surface facing a corresponding one of the plurality of light-emitting elements, the surface having a shape spreading in a direction perpendicular to the light-emitting region of the corresponding one of the light-emitting elements from an edge of the light-emitting region of the corresponding one of the light-emitting elements or a mesa step portion of the corresponding one of the light-emitting elements.

11. The light-emitting chip according to claim 3, wherein each of those edges of the primary portion and the plurality of secondary portions of the light-up current supplying interconnection has a surface facing a corresponding one of the plurality of light-emitting elements, the surface having a shape spreading in a direction perpendicular to the light-emitting region of the corresponding one of the light-emitting elements from an edge of the light-emitting region of the corresponding one of the light-emitting elements or a mesa step portion of the corresponding one of the light-emitting elements.

12. The light-emitting chip according to claim 4, wherein each of those edges of the primary portion and the plurality of secondary portions of the light-up current supplying interconnection has a surface facing a corresponding one of the plurality of light-emitting elements, the surface having a shape spreading in a direction perpendicular to the light-emitting region of the corresponding one of the light-emitting elements from an edge of the light-emitting region of the corresponding one of the light-emitting elements or a mesa step portion of the corresponding one of the light-emitting elements.

13. The light-emitting chip according to claim 5, wherein each of those edges of the primary portion and the plurality of secondary portions of the light-up current supplying interconnection has a surface facing a corresponding one of the plurality of light-emitting elements, the surface having a shape spreading in a direction perpendicular to the light-emitting region of the corresponding one of the light-emitting elements from an edge of the light-emitting region of the corresponding one of the light-emitting elements or a mesa step portion of the corresponding one of the light-emitting elements.

14. The light-emitting chip according to claim 1, wherein
the light-up current supplying interconnection covers bottom and side surfaces of the trench, and has a shape that protrudes from a light-emitting surface of the light-emitting region in a direction of light-emission.

15. A light-emitting chip comprising:
a substrate;
a plurality of light-emitting elements arrayed in line on the substrate, each of the light-emitting elements including a light-emitting region having a length in an array direction of the array different from a length in a direction orthogonal to the array direction; and
a light-up current supplying interconnection including a plurality of connecting portions, each of the connecting portions extending on the light-emitting region of a corresponding one of the light-emitting elements in such a direction either the array direction or the direction orthogonal to the array direction that an area of the light-emitting region whose light is blocked is smaller, each of the connecting portions being connected to an electrode provided on the light-emitting region, the light-up current supplying interconnection supplying a current for lighting up to the plurality of light-emitting elements through the plurality of connecting portions, wherein
each of the plurality of light-emitting elements is isolated by a trench with a mesa structure, a longer direction of the light-emitting region being orthogonal to a shorter direction of the light-emitting region, the mesa structure including a forward mesa step extending in the longer direction of the light emitting region and the mesa structure including a reverse mesa step extending in the shorter direction of the light emitting region, and
the light-up current supplying interconnection is arranged adjacent to the light-emitting region of each of the light-emitting elements, and has a reflecting surface reflecting light emitted with a spread so that the light is narrowed toward a direction perpendicular to the light-emitting region and in a direction away from the light-emitting elements.

16. A light-emitting device comprising:
a plurality of light-emitting chips each including:
  a substrate;
  a plurality of light-emitting elements arrayed in line on the substrate, each of the light-emitting elements including a light-emitting region having a length in an array direction of the array different from a length in a direction orthogonal to the array direction;
  a plurality of transfer elements provided on the substrate so as to correspond to the respective light-emitting elements, each of the transfer elements designating a corresponding light-emitting element as a control target for lighting up or not lighting up by changing to an ON state; and
  a light-up current supplying interconnection including a plurality of connecting portions, each of the connecting portions being provided on the light-emitting region of a corresponding one of the light-emitting elements in a shorter direction of the light-emitting region either the array direction or the direction orthogonal to the array direction, each of the connecting portions being connected to an electrode provided on the light-emitting region, the light-up current supplying interconnection supplying a current for lighting up to the plurality of light-emitting elements through the plurality of connecting portions,
  each of the plurality of light-emitting elements is isolated by a trench with a mesa structure, a longer direction of the light-emitting region being orthogonal to a shorter direction of the light-emitting region, the mesa structure including a forward mesa step extending in the longer direction of the light emitting region and the mesa structure including a reverse mesa step extending in the shorter direction of the light emitting region, and
  the light-up current supplying interconnection is arranged adjacent to the light-emitting region of each of the light-emitting elements, and has a reflecting surface reflecting light emitted with a spread so that the light is narrowed toward a direction perpendicular to the light-emitting region and in a direction away from the light-emitting elements, and
the light-emitting device further comprising:
  a transfer signal supplying unit transmitting transfer signals to the plurality of light-emitting chips for driving each of the transfer elements of the light-emitting chips so that the ON state sequentially propagates; and
  a light-up current supplying unit supplying a current for lighting up to the plurality of light-emitting chips.

17. A print head comprising:
a light-emitting unit; and
an optical unit causing light emitted by the light-emitting unit to form an image,
the light-emitting unit including a plurality of light-emitting chips each including:
  a substrate;
  a plurality of light-emitting elements arrayed in line on the substrate, each of the light-emitting elements including a light-emitting region having a length in an array direction of the array different from a length in a direction orthogonal to the array direction;
  a plurality of transfer elements provided on the substrate so as to correspond to the respective light-emitting elements, each of the transfer elements designating a corresponding light-emitting element as a control target for lighting up or not lighting up by changing to an ON state;
  each of the plurality of light-emitting elements is isolated by a trench with a mesa structure, a longer direction of the light-emitting region being orthogonal to a shorter direction of the light-emitting region, the mesa structure including a forward mesa step extending in the longer direction of the light emitting region and the mesa structure including a reverse mesa step extending in the shorter direction of the light emitting region, and
  a light-up current supplying interconnection including a plurality of connecting portions, each of the connecting portions being provided on the light-emitting region of a corresponding one of the light-emitting elements in a shorter direction of the light-emitting region either the array direction or the direction orthogonal to the array direction, each of the connecting portions being connected to an electrode provided on the light-emitting region, the light-up current supplying interconnection supplying a current for lighting up to the plurality of light-emitting elements through the plurality of connecting portions, the light-up current supplying interconnection is arranged adjacent to the light-emitting region of each of the light-emitting elements, and has a reflecting surface reflecting light emitted with a spread so that the light is narrowed toward a direction perpendicular to the light-emitting region and in a direction away from the light-emitting elements, and the light-emitting unit further including:
a transfer signal supplying unit transmitting transfer signals to the plurality of light-emitting chips for driving each of the transfer elements of the light-emitting chips so that the ON state sequentially propagates; and
a light-up current supplying unit supplying a current for lighting up to the plurality of light-emitting chips.

18. An image forming apparatus comprising:
an image carrier;
a charging unit charging the image carrier;
an exposure unit exposing the image carrier through an optical unit;
a developing unit developing an electrostatic latent image exposed by the exposure unit and formed on the image carrier; and
a transfer unit transferring an image developed on the image carrier to a transferred body,
the exposure unit including a plurality of light-emitting chips each including:
a substrate;
a plurality of light-emitting elements arrayed in line on the substrate, each of the light-emitting elements including a light-emitting region having a length in an array direction of the array different from a length in a direction orthogonal to the array direction;
a plurality of transfer elements provided on the substrate so as to correspond to the respective light-emitting elements, each of the transfer elements designating a corresponding light-emitting element as a control target for lighting up or not lighting up by changing to an ON state;

each of the plurality of light-emitting elements is isolated by a trench with a mesa structure, a longer direction of the light-emitting region being orthogonal to a shorter direction of the light-emitting region, the mesa structure including a forward mesa step extending in the longer direction of the light emitting region and the mesa structure including a reverse mesa step extending in the shorter direction of the light emitting region, and a light-up current supplying interconnection including a plurality of connecting portions, each of the connecting portions being provided on the light-emitting region of a corresponding one of the light-emitting elements in a shorter direction of the light-emitting region either the array direction or the direction orthogonal to the array direction, each of the connecting portions being connected to an electrode provided on the light-emitting region, the light-up current supplying interconnection supplying a current for lighting up to the plurality of light-emitting elements through the plurality of connecting portions, the light-up current supplying interconnection is arranged adjacent to the light-emitting region of each of the light-emitting elements, and has a reflecting surface reflecting light emitted with a spread so that the light is narrowed toward a direction perpendicular to the light-emitting region and in a direction away from the light-emitting elements, and the exposure unit further including:
a transfer signal supplying unit transmitting transfer signals to the plurality of light-emitting chips for driving each of the transfer elements of the light-emitting chips so that the ON state sequentially propagates; and
a light-up current supplying unit supplying a current for lighting up to the plurality of light-emitting chips.

* * * * *